United States Patent
Yu et al.

(10) Patent No.: US 7,628,622 B2
(45) Date of Patent: Dec. 8, 2009

(54) MULTI-LEVEL CELL (MLC) SLIDE FLASH MEMORY

(75) Inventors: Frank I-Kang Yu, Palo Alto, CA (US); David Nguyen, San Jose, CA (US); Jim Chin-Nan Ni, San Jose, CA (US); Abraham C. Ma, Fremont, CA (US); Ming-Shiang Shen, Taipei (TW)

(73) Assignee: Super Talent Electronics, Inc., San Jose, CA (US)

( * ) Notice: Subject to any disclaimer, the term of this patent is extended or adjusted under 35 U.S.C. 154(b) by 46 days.

(21) Appl. No.: 12/050,748

(22) Filed: Mar. 18, 2008

(65) Prior Publication Data

US 2008/0233798 A1 Sep. 25, 2008

Related U.S. Application Data

(63) Continuation-in-part of application No. 12/025,706, filed on Feb. 4, 2008, and a continuation-in-part of application No. 11/871,627, filed on Oct. 12, 2007, and a continuation-in-part of application No. 11/871,011, filed on Oct. 11, 2007, and a continuation-in-part of application No. 11/742,270, filed on Apr. 30, 2007, and a continuation-in-part of application No. 11/737,336, filed on Apr. 19, 2007, now Pat. No. 7,333,364, and a continuation-in-part of application No. 11/674,645, filed on Feb. 13, 2007, and a continuation-in-part of application No. 11/864,671, filed on Sep. 28, 2007, which is a continuation-in-part of application No. 10/789,333, filed on Feb. 26, 2004, now Pat. No. 7,318,117, application No. 12/050,748, which is a continuation-in-part of application No. 11/845,747, filed on Aug. 27, 2007.

(51) Int. Cl.
*H01R 13/44* (2006.01)

(52) U.S. Cl. .................................... 439/131
(58) Field of Classification Search .............. 439/131, 439/79, 76.1; 361/684, 752, 756, 683–686
See application file for complete search history.

(56) References Cited

U.S. PATENT DOCUMENTS

| | | | |
|---|---|---|---|
| 5,623,552 A | 4/1997 | Lane | |
| 5,859,766 A * | 1/1999 | Van Scyoc et al. | 361/752 |
| 5,907,856 A | 5/1999 | Estakhri et al. | |
| 5,959,541 A | 9/1999 | DiMaria et al. | |
| 6,000,006 A | 12/1999 | Bruce et al. | |
| 6,012,636 A | 1/2000 | Smith | |
| 6,069,920 A | 5/2000 | Schulz et al. | |
| 6,081,858 A | 6/2000 | Abudayyeh et al. | |
| 6,125,192 A | 9/2000 | Bjorn et al. | |
| 6,193,152 B1 | 2/2001 | Fernando et al. | |
| 6,202,138 B1 | 3/2001 | Estakhri et al. | |
| 6,230,233 B1 | 5/2001 | Lofgren et al. | |

(Continued)

*Primary Examiner*—Jean F Duverne
(74) *Attorney, Agent, or Firm*—Blakely Sokoloff Taylor & Zafman LLP

(57) ABSTRACT

A portable USB device with an improved configuration is described herein. According to one embodiment, a portable USB device includes a core unit having a USB plug connector coupled to one or more multi-level cell (MLC) flash memory devices and an MLC flash controller disposed therein. The portable USB device further includes a housing for enclosing the core unit, including a front end opening to allow the USB plug connector to be deployed. The portable USB device further includes a core unit carrier for carrying the core unit for deploying and retracting the core unit, including a slide button to allow a finger of a user to slide the USB plug connector of the core unit in and out of the housing via the front end opening of the housing.

19 Claims, 41 Drawing Sheets

U.S. PATENT DOCUMENTS

| | | |
|---|---|---|
| 6,275,894 B1 | 8/2001 | Kuo et al. |
| 6,321,478 B1 | 11/2001 | Klebes |
| 6,547,130 B1 | 4/2003 | Shen |
| 6,636,929 B1 | 10/2003 | Frantz et al. |
| 6,718,407 B2 | 4/2004 | Martwick |
| 6,880,024 B2 | 4/2005 | Chen et al. |
| 6,999,322 B1 * | 2/2006 | Lin ............................ 361/752 |
| 7,103,765 B2 | 9/2006 | Chen |
| 7,249,978 B1 | 7/2007 | Ni |
| 7,257,714 B1 | 8/2007 | Shen |
| 7,269,004 B1 * | 9/2007 | Ni et al. ................. 361/679.41 |
| 2002/0166023 A1 | 11/2002 | Nolan et al. |
| 2003/0046510 A1 | 3/2003 | North |
| 2003/0163656 A1 | 8/2003 | Ganton |
| 2004/0148482 A1 | 7/2004 | Grundy et al. |
| 2004/0255054 A1 | 12/2004 | Pua et al. |
| 2005/0102444 A1 | 5/2005 | Cruz |
| 2005/0120146 A1 | 6/2005 | Chen et al. |
| 2005/0160213 A1 | 7/2005 | Chen |
| 2005/0193161 A1 | 9/2005 | Lee et al. |
| 2005/0246243 A1 | 11/2005 | Adams et al. |
| 2005/0268082 A1 | 12/2005 | Poisner |
| 2006/0065743 A1 | 3/2006 | Fruhauf |
| 2006/0075174 A1 | 4/2006 | Vuong |
| 2006/0106962 A1 | 5/2006 | Woodbridge et al. |
| 2006/0161725 A1 | 7/2006 | Lee et al. |
| 2006/0206702 A1 | 9/2006 | Fausak |
| 2006/0242395 A1 | 10/2006 | Fausak |
| 2007/0094489 A1 | 4/2007 | Ota et al. |
| 2007/0113067 A1 | 5/2007 | Oh et al. |
| 2007/0113267 A1 | 5/2007 | Iwanski et al. |
| 2007/0130436 A1 | 6/2007 | Shen |
| 2008/0232060 A1 * | 9/2008 | Yu et al. ..................... 361/684 |

* cited by examiner

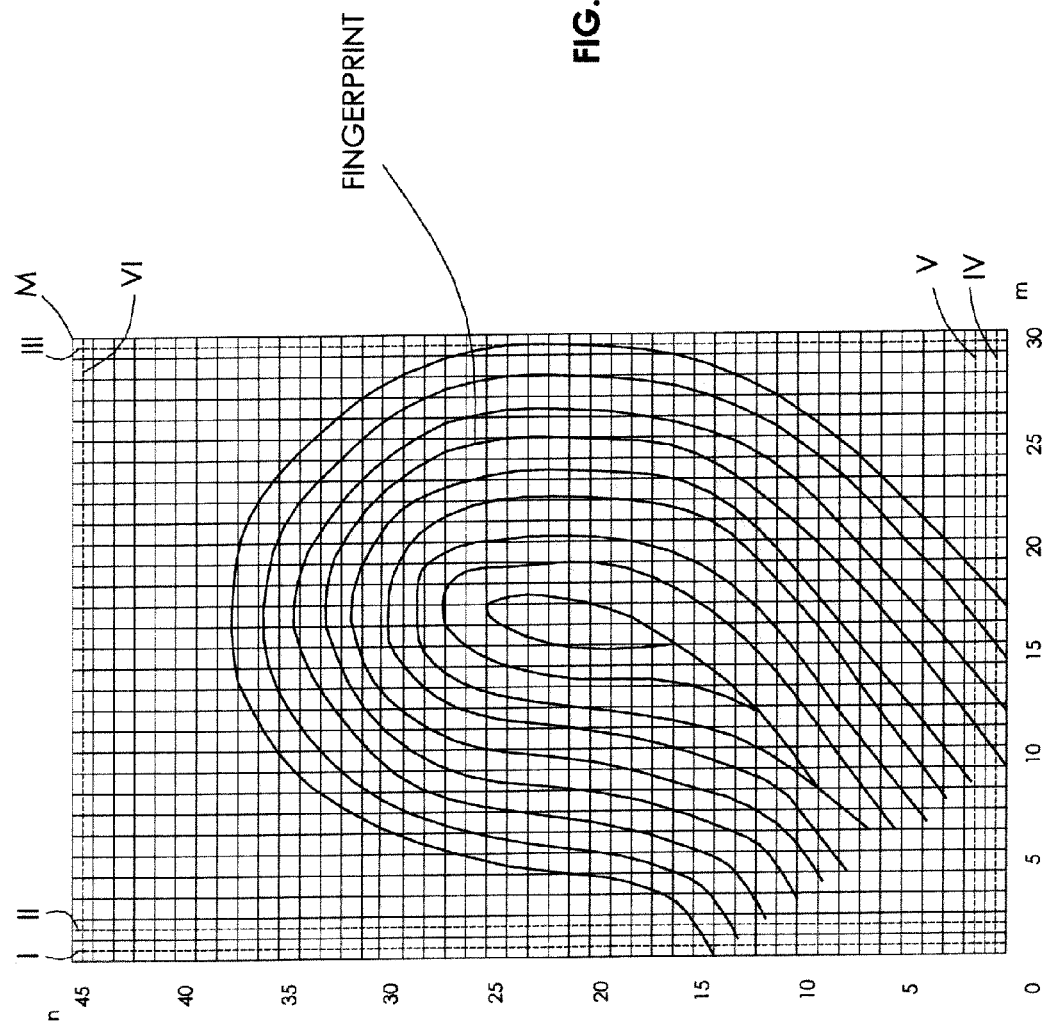

Data structure of PLTPPUI in Reserved Area of MLC Flash Memory 420

Old physical block (PBK#1000) for storing PLTPPUI0 422

| | | 427 | 442 | 446 |
|---|---|---|---|---|
| 1st Write (P0) 424a | Entry 0 | Entry 1 | ... | FF | Special Logical Address for PLTPPUI0 | 1 |
| 2nd Write (P1) 424b | Entry 0 | Entry 1 | | | |
| ... | | | | | |
| nth Write (Pn) 424n | Entry 0 | Entry 1 | ... | | |

425 426

New physical block (PBK#1012) for storing PLTPPUI0 432

| (n+1)th Write (P0) 434 | Entry 0 | Entry 1 | ... | FF | Special Logical Address for PLTPPUI0 | 2 |
|---|---|---|---|---|---|---|
| | | | | | | |
| | | | | | | |
| | | | | | | |

*FIG. 4C*

Data Structure of the PLTPPUI Tracking Table 440

| | Physical Block Number 444 | Tracking No. (TN) 446 | Highest Page 448 |
|---|---|---|---|
| Special Logical Address for PLTPPUI0 | 1012 | 0 | 0 |
| Special Logical Address for PLTPPUI1 | 1018 | 5 | 1 |
| ... | | | |
| Special Logical Address for PLTPPUIN | 1005 | 4 | 0 |

Data Structure of the WL/BB Tracking Table 450

| | Physical Block Number 454 | Tracking No. (TN) 456 | Highest Page 458 |
|---|---|---|---|
| Special Logical Address for WL/BB0 | 1023 | 1 | 5 |
| Special Logical Address for WL/BB1 | 1020 | 0 | 3 |
| ⋮ | | | |
| Special Logical Address for WL/BBn | 1021 | 3 | 7 |

Data Structure of the WL/BB Tracking Table in Reserved Area of Flash Memory 460

| | | | | 467 | 452 | 456 |
|---|---|---|---|---|---|---|
| 1st Write (P0) | BK0 (Reserved) | BK1 WL | | | | 1 |
| 2nd Write (P1) | | BK1 WL old | BK3 WL new | | F F | Special Logical Address for WL/BB1 |
| 3rd Write (P2) | | BK1 WL old | BK3 WL old | BK5 WL new | | |
| ⋮ | | | | | | |
| nth Write (Pn) | | | | | BK7 BB FFFF FFEE | BK1000 WL new |

| | | | | |
|---|---|---|---|---|
| 1st Write (P0) | BK1000 WL new | | | 1 |
| 2nd Write (P1) | BK1000 WL old | BK1003 BB | BK1021 WL new | F F Special Logical Address for WL/BB2 |
| ⋮ | | | | |
| nth Write (Pn) | | | | |

*FIG. 4F*

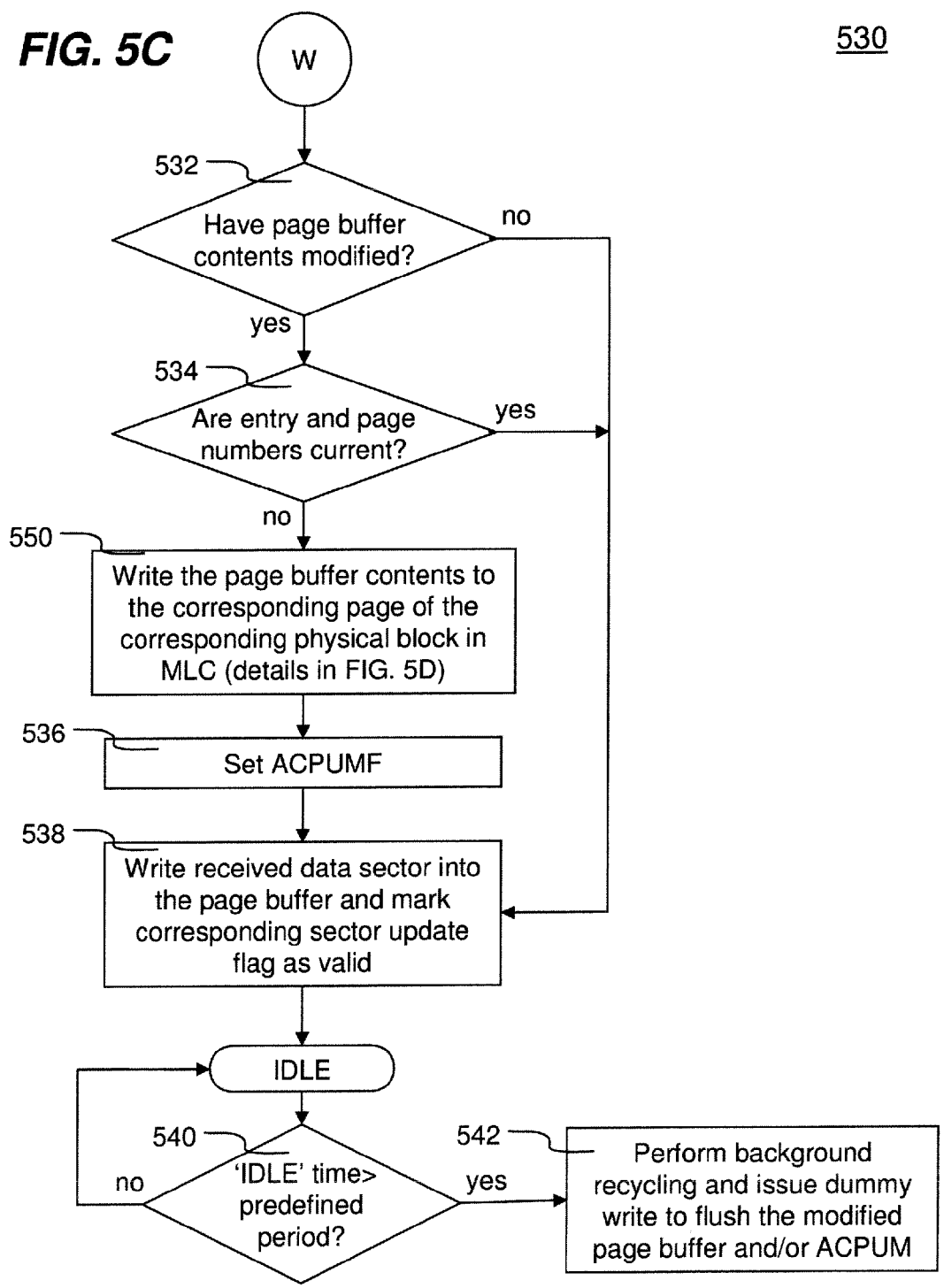

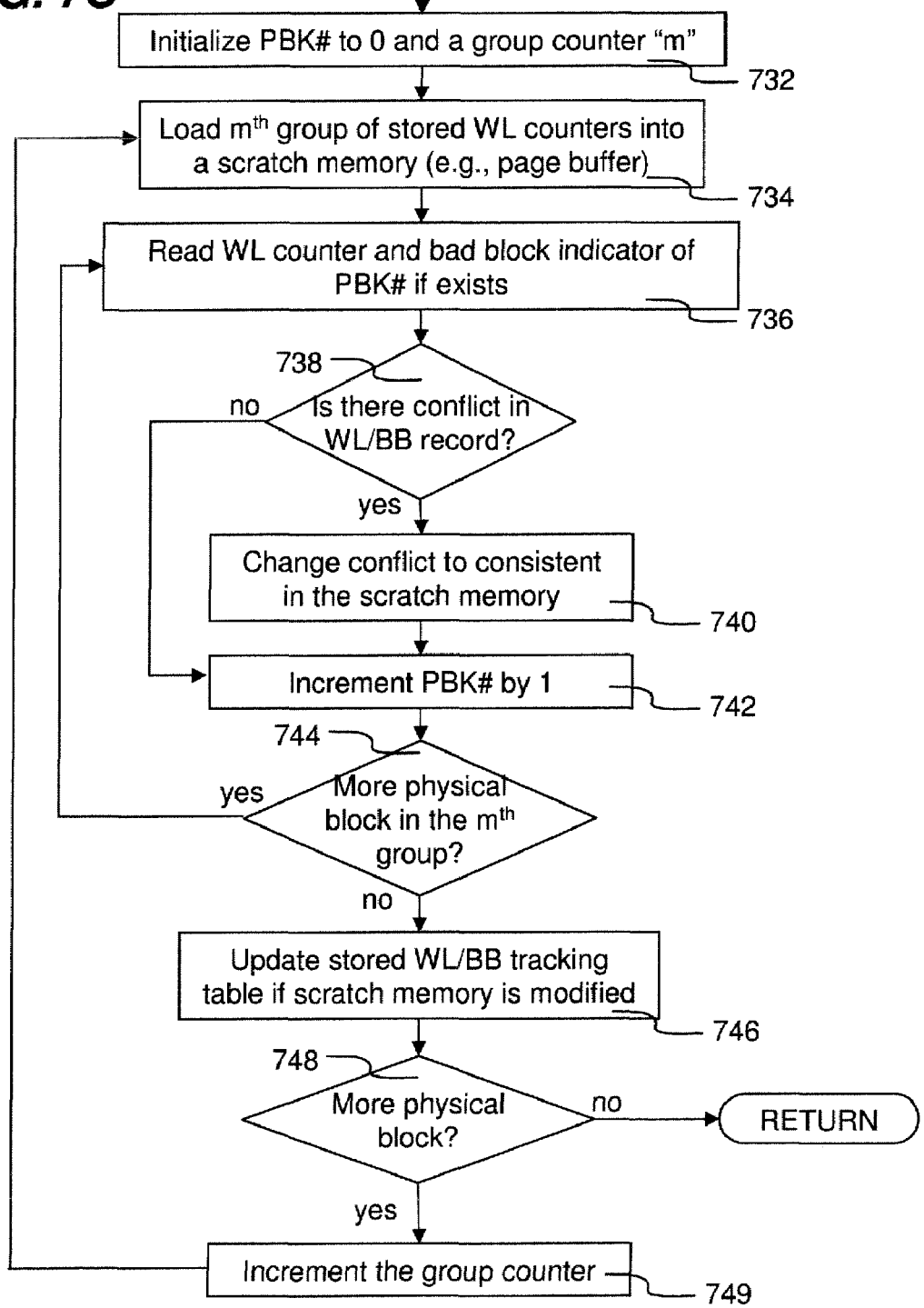

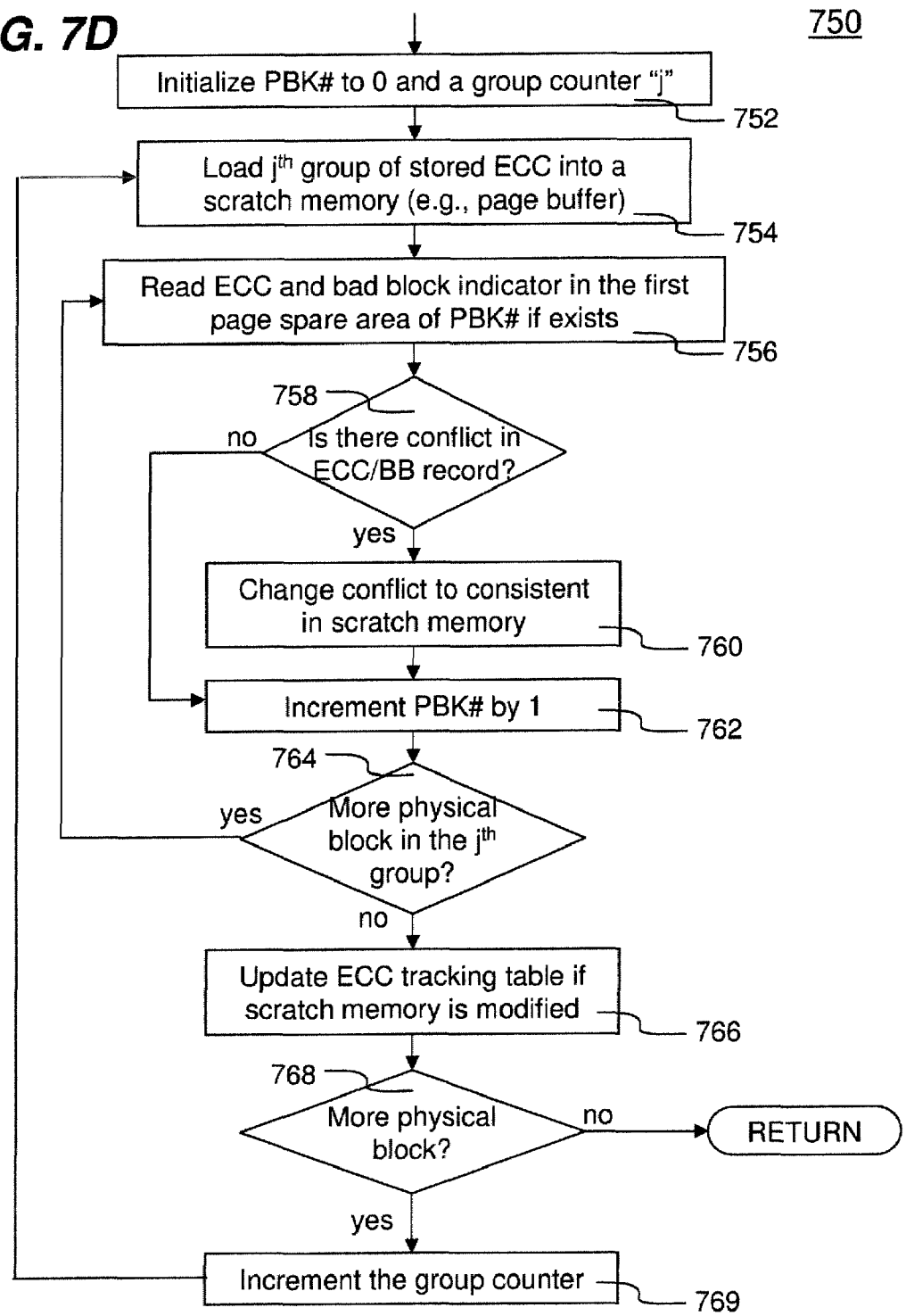

MULTI-LEVEL CELL (MLC) SLIDE FLASH MEMORY

CROSS-REFERENCE TO RELATED APPLICATIONS

This application is a continuation-in-part (CIP) of co-pending U.S. patent application for "Methods and Systems of Managing Memory Addresses in a Large Capacity Multi-Level Cell (MLC) based flash memory device", Ser. No. 12/025,706, filed Feb. 4, 2008.

This application is a continuation-in-part (CIP) of co-pending U.S. patent application for "Flash Module with Plane-Interleaved Sequential Writes to Restricted-Write Flash Chips", Ser. No. 11/871,011, filed Oct. 11, 2007, U.S. patent application for "Multi-Channel Flash Module with Plane-Interleaved Sequential ECC Writes and Background Recycling to Restricted-Write Flash Chips", Ser. No. 11/871,627, filed Oct. 12, 2007, and U.S. patent application for "Cell-Downgrading and Reference-Voltage Adjustment for A Multi-Bit-Cell Flash Memory", Ser. No. 11/737,336, filed on Apr. 19, 2007.

This application is also a CIP of U.S. patent application for "Recycling Partially-Stale Flash Blocks Using a Sliding Window for Multi-Level-Cell (MLC) Flash Memory", Ser. No. 11/674,645, filed Feb. 13, 2007 and U.S. patent application for "Two-Level RAM Lookup Table for Block and Page Allocation and Wear-Leveling in Limited-Write Flash Memories", Ser. No. 11/742,270, filed Apr. 30, 2007.

This application is also a CIP of U.S. patent application for "Electronic data Flash Card with Various Flash Memory Cells", Ser No. 11/864,671, filed Sep. 28, 2007, which is a CIP of U.S. patent application for "Managing Flash Memory Including Recycling Obsolete Sectors", Ser. No. 10/789,333, filed Feb. 26, 2004, now issued as U.S. Pat. No. 7,318,117.

This application is also a CIP of co-pending U.S. patent application for "Press/Push USB Flash Drive with Deploying and Retracting Functionalities with Elasticity Material and Fingerprint Verification Capability", Ser. No. 11/845,747, filed Aug. 27, 2007.

This application relates to U.S. Patent application for "Portable Computer Peripheral Apparatus with Retractable Plug Connector", U.S. Pat. No. 7,004,780, filed May 13, 2004. The disclosure of the above-identified U.S. patent applications and patents is incorporated herein in its entirety.

FIELD OF THE INVENTION

The invention relates to flash memory devices, more particularly to systems and methods of managing memory addresses in a large capacity multi-level cell (MLC) based flash memory device.

BACKGROUND OF THE INVENTION

As flash memory technology becomes more advanced, flash memory is replacing traditional magnetic disks as storage media for mobile systems. Flash memory has significant advantages over floppy disks or magnetic hard disks such as having high-G resistance and low power dissipation. Because of the smaller physical size of flash memory, they are also more conducive to mobile systems. Accordingly, the flash memory trend has been growing because of its compatibility with mobile systems and low-power feature. However, advances in flash technology have created a greater variety of flash memory device types that vary for reasons of performance, cost and capacity. As such, a problem arises when mobile systems that are designed for one type of flash memory are constructed using another, incompatible type of flash memory.

New generation personal computer (PC) card technologies have been developed that combine flash memory with architecture that is compatible with the Universal Serial Bus (USB) standard. This has further fueled the flash memory trend because the USB standard is easy to implement and is popular with PC users. In addition, flash memory is replacing floppy disks because flash memory provides higher storage capacity and faster access speeds than floppy drives.

In addition to the limitations introduced by the USB standard, there are inherent limitations with flash memory. First, flash memory sectors that have already been programmed must be erased before being reprogrammed. Also, flash memory sectors have a limited life span; i.e., they can be erased only a limited number of times before failure. Accordingly, flash memory access is slow due to the erase-before-write nature and ongoing erasing will damage the flash memory sectors over time.

To address the speed problems with USB-standard flash memory, hardware and firmware utilize existing small computer systems interface (SCSI) protocols so that flash memory can function as mass-storage devices similarly to magnetic hard disks. SCSI protocols have been used in USB-standard mass-storage devices long before flash memory devices have been widely adopted as storage media. Accordingly, the USB standard has incorporated traditional SCSI protocols to manage flash memory.

As the demands for larger capacity storage increase, the flash memory device needs to keep up. Instead of using single-level cell flash memory, which stores one-bit of information per cell, multi-level cell (MLC) flash memory is used. The MLC flash memory allows at least two bits per cell. However, there are a number of problems associated with the MLC flash memory. First, the MLC flash memory has a low reliability. Secondly, the MLC flash memory data programming rules require writing to an ascending page in the same block or writing to a blank new page if there are data existed in the original page. Finally, a larger capacity requires a large logical-to-physical address look up table. In the prior art approach, the size look up table is in direct portion with the capacity of the flash memory. This creates a huge problem not only to the cost, but also to the physical size of the flash memory device. Furthermore, the traditional usage of the flash memory devices is generally in a very clean and relatively mild environment, thus the packaging design such as enclosure of the flash memory device is not suitable for hostile environment such as military and heavy industrial applications.

BRIEF SUMMARY OF THE INVENTION

A portable USB device with an improved configuration is described herein. According to one embodiment, a portable USB device includes a core unit having a USB plug connector coupled to one or more multi-level cell (MLC) flash memory devices and an MLC flash controller disposed therein, the MLC flash controller controlling the one or more MLC flash memory devices and the USB plug connector providing an interface for accessing the one or more MLC flash memory devices. The portable USB device further includes a housing having a top housing and a bottom housing for enclosing the core unit, where the top housing and the bottom housing when attached together form a front end opening to allow the USB plug connector to be deployed external to the housing. The portable USB device further includes a core unit carrier for carrying the core unit to slide the USB plug connector in and out via the front end opening of the housing for deploying and retracting the core unit, where the core unit carrier includes a slide button disposed on a top surface of the core unit carrier. The top housing further includes a slide button opening, which when the top housing and the bottom housing enclose the core unit carrier carrying the core unit, causes the slide button of the core unit carrier to be exposed external to the top housing via the slide button opening. The exposed button allows a finger of a user to slide the USB plug connector of the core unit in and out of the housing via the front end opening of the housing. When the slide button slides forwardly towards a front end of the housing, the USB plug connector of the core unit is in a deployed position and when the slide button slides backwardly towards a backend of the housing, the USB plug connector of the core unit is in retracted position by retracting the USB plug connector into the housing.

BRIEF DESCRIPTION OF THE DRAWINGS

These and other features, aspects, and advantages of the present invention will be better understood with regard to the following description, appended claims, and accompanying drawings as follows:

FIGS. 1D-1H are diagrams illustrating scanning lines of a fingerprint from an "Area" fingerprint sensor.

FIGS. 4A-4F collectively show exemplary data structures used for managing memory addresses of the flash memory of FIG. 2A in accordance with one embodiment of the present invention;

FIGS. 5A-5E collectively show a flow chart of an exemplary process of conducting data transfer requests of the flash memory of FIG. 2A in accordance with one embodiment of the present invention;

FIGS. 7A-7E collectively are a flowchart illustrating an exemplary process of initialization of a large capacity flash memory device in accordance with one embodiment of the present invention.

DETAILED DESCRIPTION

In the following description, numerous details are set forth to provide a more thorough explanation of embodiments of the present invention. It will be apparent, however, to one skilled in the art, that embodiments of the present invention may be practiced without these specific details. In other instances, well-known structures and devices are shown in block diagram form, rather than in detail, in order to avoid obscuring embodiments of the present invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Used herein, the terms "upper", "lower", "top", "bottom", "front", "back", "rear", "side", "middle", "upwards", and "downwards" are intended to provide relative positions for the purposes of description, and are not intended to designate an absolute frame of reference. Further, the order of blocks in process flowcharts or diagrams representing one or more embodiments of the invention do not inherently indicate any particular order nor imply any limitations in the invention.

Embodiments of the present invention are discussed herein with reference to FIGS. 1A-8I. However, those skilled in the art will readily appreciate that the detailed description given herein with respect to these figures is for explanatory purposes as the invention extends beyond these limited embodiments.

Figure 1A:
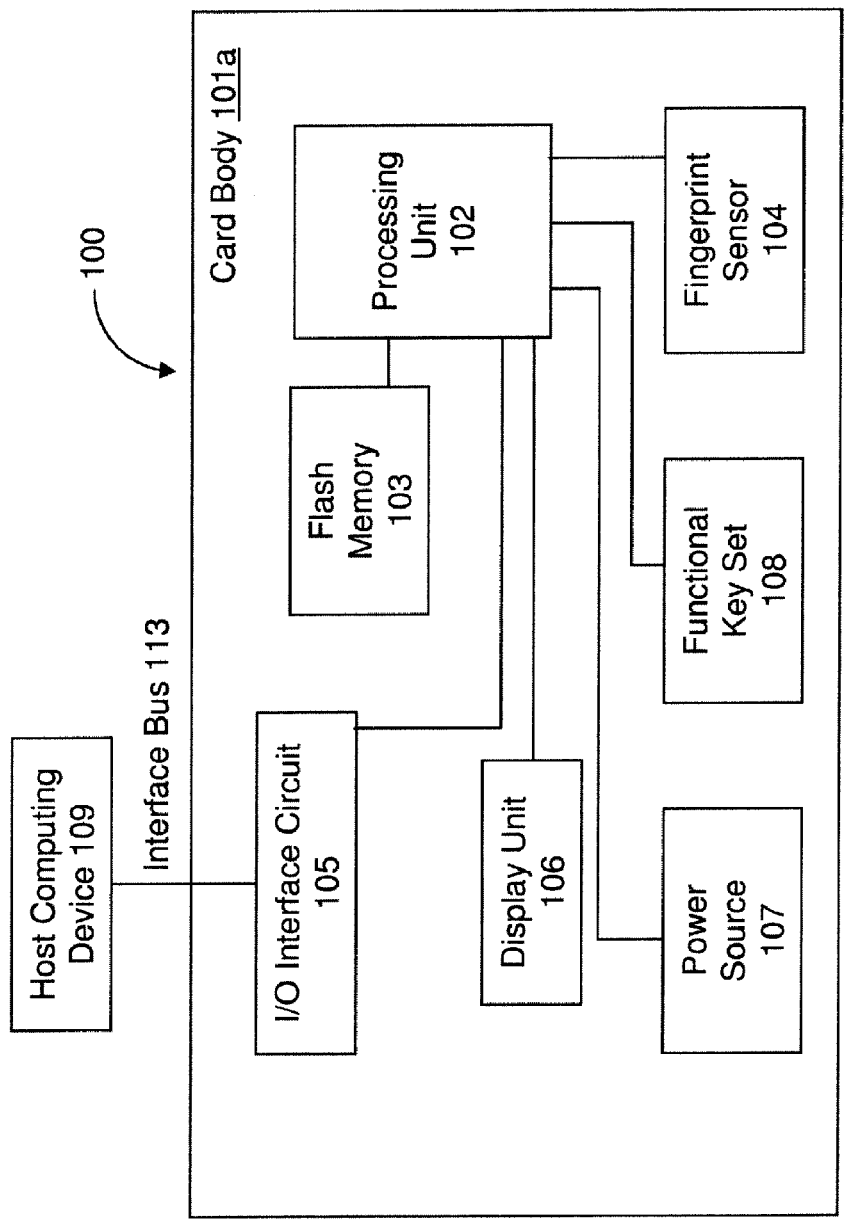
FIGS. 1A-1C are block diagrams showing three electronic environments, in which one embodiment of the present invention may be implemented in three respective exemplary electronic flash memory devices.
Figure 1B:
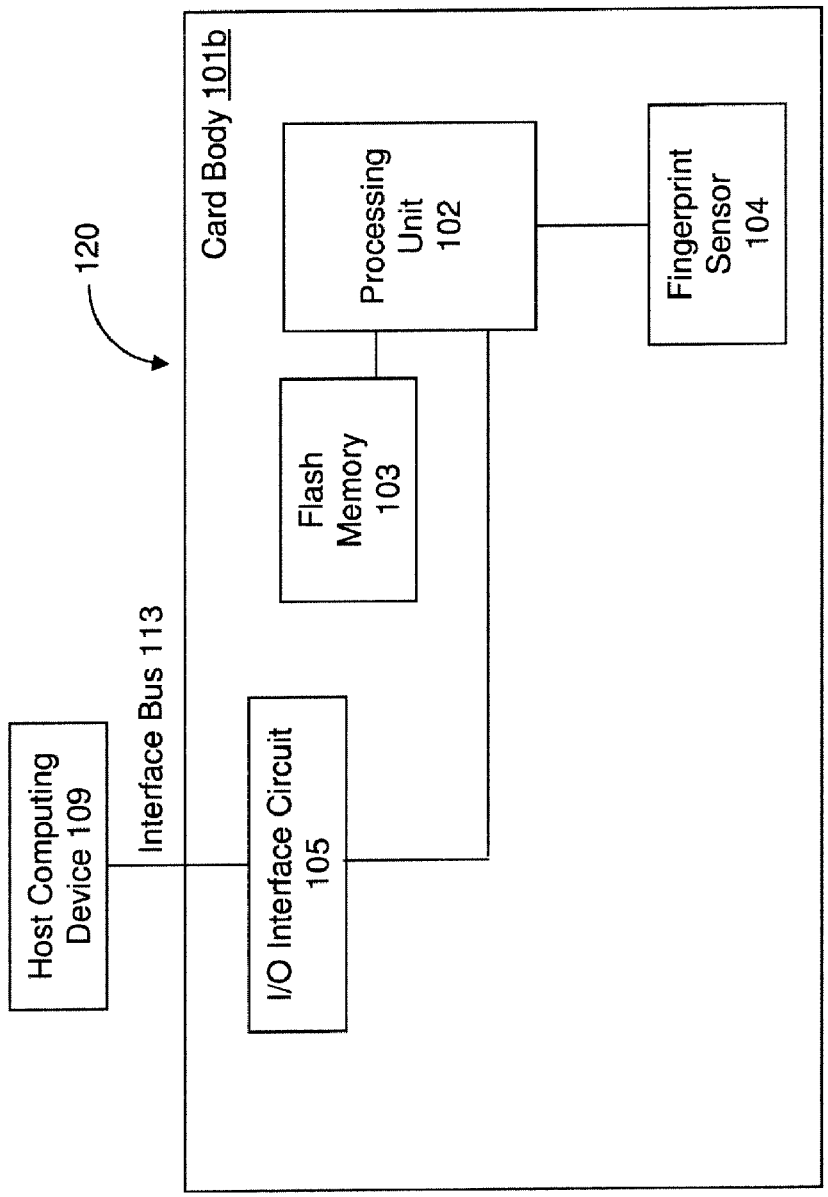
Figure 1C:
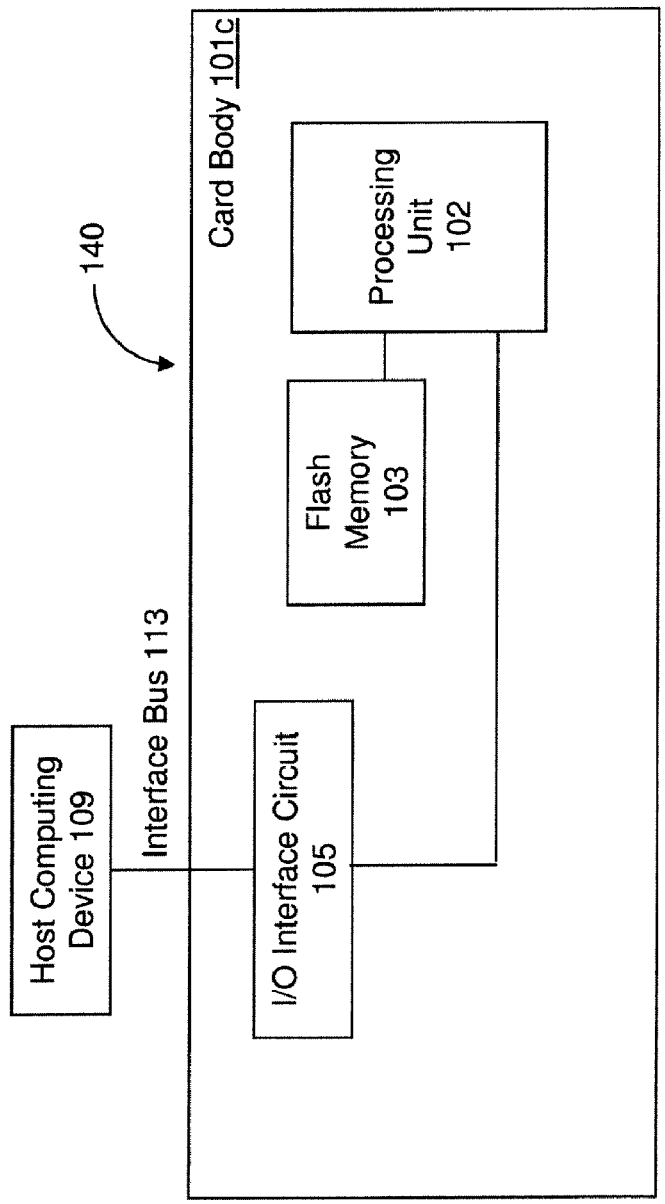

FIGS. 1A-1C are block diagrams illustrating three electronic environments, in which one embodiment of the present invention may be deployed in three respective exemplary electronic flash memory devices. Shown in FIG. 1A is a first electronic environment. A first flash memory device 100 is adapted to be accessed by a host computing device 109 via an interface bus 113. The first flash memory device 100 includes a card body 101a, a processing unit 102, at least one flash memory module 103, a fingerprint sensor 104, an input/output (I/O) interface circuit 105, an optional display unit 106, an optional power source (e.g., battery) 107, and an optional function key set 108. The host computing device 109 may include, but not be limited to, a desktop computer, a laptop computer, a mother board of a personal computer, a cellular phone, a digital camera, a digital camcorder, a personal multimedia player.

The card body 101a is configured for providing electrical and mechanical connection for the processing unit 102, the flash memory module 103, the I/O interface circuit 105, and all of the optional components. The card body 101a may comprise a printed circuit board (PCB) or an equivalent substrate such that all of the components as integrated circuits may be mounted thereon. The substrate may be manufactured using surface mount technology (SMT) or chip on board (COB) technology.

The processing unit 102 and the I/O interface circuit 105 are collectively configured to provide various control functions (e.g., data read, write and erase transactions) of the flash memory module 103. The processing unit 102 may also be a standalone microprocessor or microcontroller, for example, an 8051, 8052, or 80286 Intel® microprocessor, or ARM®, MIPS® or other equivalent digital signal processor. The processing unit 102 and the I/O interface circuit 105 may be made in a single integrated circuit, for application specific integrated circuit (ASIC).

The at least one flash memory module 103 may comprise one or more flash memory chips or integrated circuits. The flash memory chips may be single-level cell (SLC) or multi-level cell (MLC) based. In SLC flash memory, each cell holds one bit of information, while more than one bit (e.g., 2, 4 or more bits) are stored in a MLC flash memory cell. A detail data structure of an exemplary flash memory is described and shown in FIG. 2A and corresponding descriptions thereof.

The fingerprint sensor 104 is mounted on the card body 101a, and is adapted to scan a fingerprint of a user of the first electronic flash memory device 100 to generate fingerprint scan data. Details of the fingerprint sensor 104 are shown and described in a co-inventor's U.S. Pat. No. 7,257,714, entitled "Electronic Data Storage Medium with Fingerprint Verification Capability" issued on Aug. 14, 2007, the entire content of which is incorporated herein by reference.

The flash memory module 103 stores, in a known manner therein, one or more data files, a reference password, and the fingerprint reference data obtained by scanning a fingerprint of one or more authorized users of the first flash memory device. Only authorized users can access the stored data files. The data file can be a picture file, a text file or any other file. Since the electronic data storage compares fingerprint scan data obtained by scanning a fingerprint of a user of the device with the fingerprint reference data in the memory device to verify if the user is the assigned user, the electronic data storage can only be used by the assigned user so as to reduce the risks involved when the electronic data storage is stolen or misplaced.

The input/output interface circuit 105 is mounted on the card body 101a, and can be activated so as to establish communication with the host computing device 109 by way of an appropriate socket via an interface bus 113. The input/output interface circuit 105 may include circuits and control logic associated with a Universal Serial Bus (USB) interface structure that is connectable to an associated socket connected to or mounted on the host computing device 109.

The processing unit 102 is controlled by a software program module (e.g., a firmware (FW)), which may be stored partially in a ROM (not shown) such that processing unit 102 is operable selectively in: (1) a data programming or write mode, where the processing unit 102 activates the input/output interface circuit 105 to receive data from the host computing device 109 and/or the fingerprint reference data from fingerprint sensor 104 under the control of the host computing device 109, and store the data and/or the fingerprint reference data in the flash memory module 103; (2) a data retrieving or read mode, where the processing unit 102 activates the input/output interface circuit 105 to transmit data stored in the flash memory module 103 to the host computing device 109; or (3) a data resetting or erasing mode, where data in stale data blocks are erased or reset from the flash memory module 103. In operation, host computing device 109 sends write and read data transfer requests to the first flash memory device 100 via the interface bus 113, then the input/output interface circuit 105 to the processing unit 102, which in turn utilizes a flash memory controller (not shown or embedded in the processing unit) to read from or write to the associated at least one flash memory module 103. In one embodiment, for further security protection, the processing unit 102 automatically initiates an operation of the data resetting mode upon detecting a predefined time period has elapsed since the last authorized access of the data stored in the flash memory module 103.

The optional power source 107 is mounted on the card body 101a, and is connected to the processing unit 102 and other associated units on card body 101a for supplying electrical power (to all card functions) thereto. The optional function key set 108, which is also mounted on the card body 101a, is connected to the processing unit 102, and is operable so as to initiate operation of processing unit 102 in a selected one of the programming, data retrieving and data resetting modes. The function key set 108 may be operable to provide an input password to the processing unit 102. The processing unit 102 compares the input password with the reference password stored in the flash memory module 103, and initiates authorized operation of the first flash memory device 100 upon verifying that the input password corresponds with the reference password. The optional display unit 106 is mounted on the card body 101a, and is connected to and controlled by the processing unit 102 for displaying data exchanged with the host computing device 109.

A second electronic environment is shown in a second environment in FIG. 1B. The second environment is very similar to the first environment as shown in FIG. 1A. The differences are the optional components (i.e., display unit 106, power source 107 and functional key set 108) are not included in card body 101b of the second electronic flash memory device 120. Instead, such functionalities may be implemented using the existing ones provided by the host computer 109 via the interface bus 113.

Shown in FIG. 1C, the third electronic flash memory device 140 includes a card body 101c with a processing unit 102, an I/O interface circuit 105 and at least one flash memory module 103 mounted thereon. Similar to the two aforementioned environments, the third flash memory device 140 couples to a host computing device 109 via an interface bus 113. Fingerprint functions such as scanning and verification are handled by the host computing device 109.

The fingerprint sensor is adapted to scan a fingerprint of a user and to generate fingerprint scan data. One example of the fingerprint sensor that can be used in the present invention is that disclosed in a co-owned U.S. Pat. No. 6,547,130, entitled "Integrated Circuit Card with Fingerprint Verification Capability", which is incorporated herein by reference herein. The fingerprint sensor described in the above patent includes an array of scan cells that defines a fingerprint scanning area. The fingerprint scan data includes a plurality of scan line data obtained by scanning corresponding lines of array of scan cells. The lines of array of scan cells are scanned in a row direction as well as column direction of the array. Each of the scan cells generates a first logic signal upon detection of a ridge in the fingerprint of the holder of card body, and a second logic signal upon detection of a valley in the fingerprint of the holder of card body.

As shown in FIG. 1D, the fingerprint sensor is adapted to scan a fingerprint of a holder of the card body and to generate fingerprint scan data. Referring to FIG. 1D, the fingerprint sensor includes an m×n array of scan cells that defines a fingerprint scanning area (M) The fingerprint scan data includes a plurality of scan line data obtained by scanning corresponding lines of the array of scan cells. The holder of the card body needs to press and hold his/her finger to the surface of the fingerprint sensor. The lines of the array of scan cells can be scanned in a column direction or a row direction of the array. For example, if m=30, n=45, a first scanning line (I) in the column direction is (1'n; n=1.about.45), a second scanning line (II) in the column direction is (2'n; n=1.about.45), and a thirtieth scanning line (III), the last scanning line in the column direction, is (30'n; n=1.about.45). A first scanning line (IV) in the row direction is (m'1; m=1.about.30), a second scanning line (V) in the row direction is (m'2; m=1.about.30), and a forty-fifth scanning line, the last scanning line in the row direction, is (m'45; m=1.about.30). Each of the scan cells generates a high logic signal upon detection of a ridge in the fingerprint of the holder of the card body, and a low logic signal upon detection of a valley in the fingerprint of the holder of the card body.

Figure 1E:
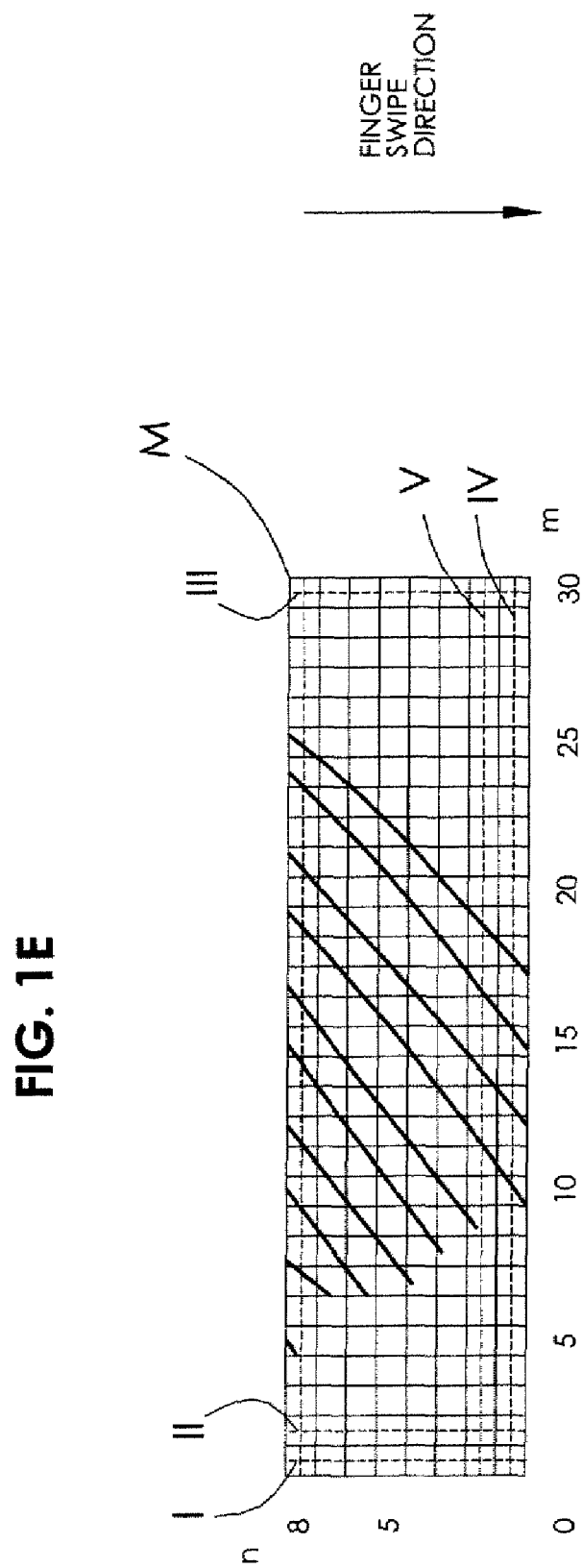
Figure 1F:
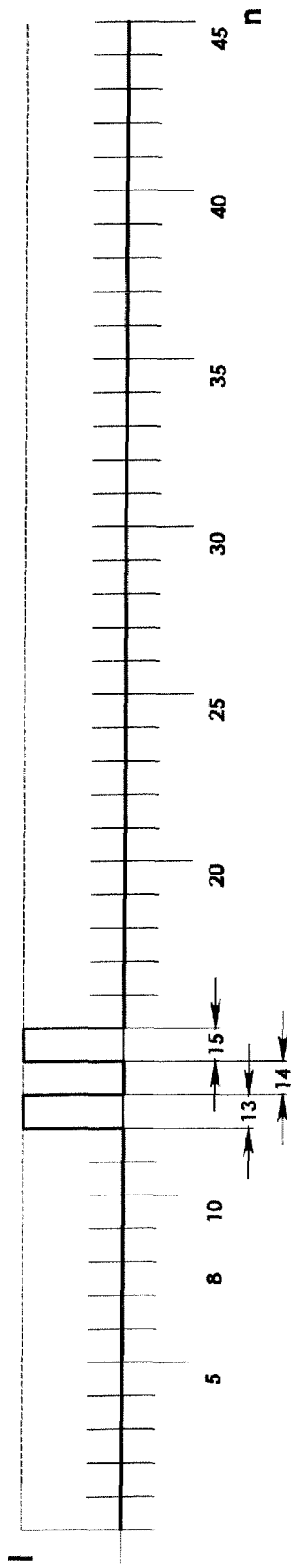
Figure 1G:
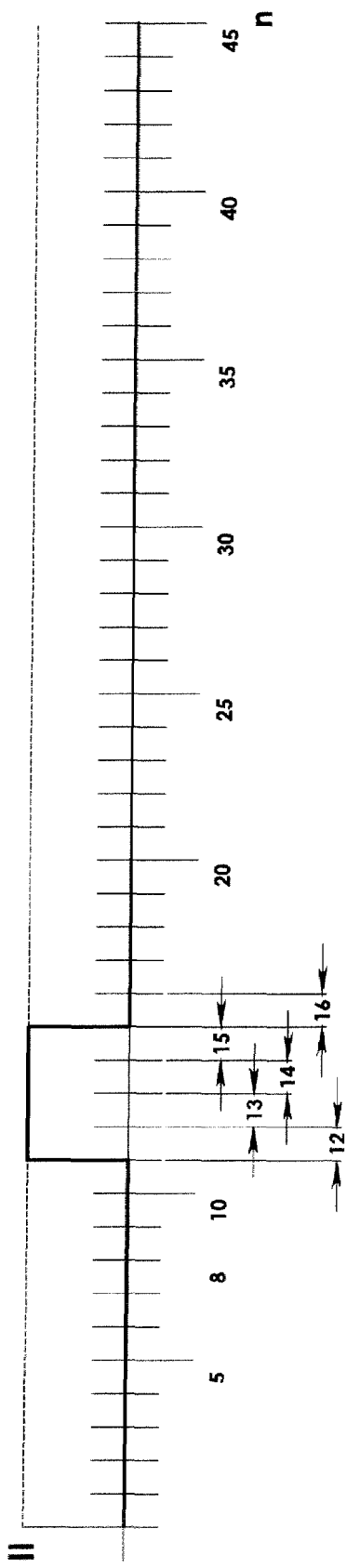
Figure 1H:
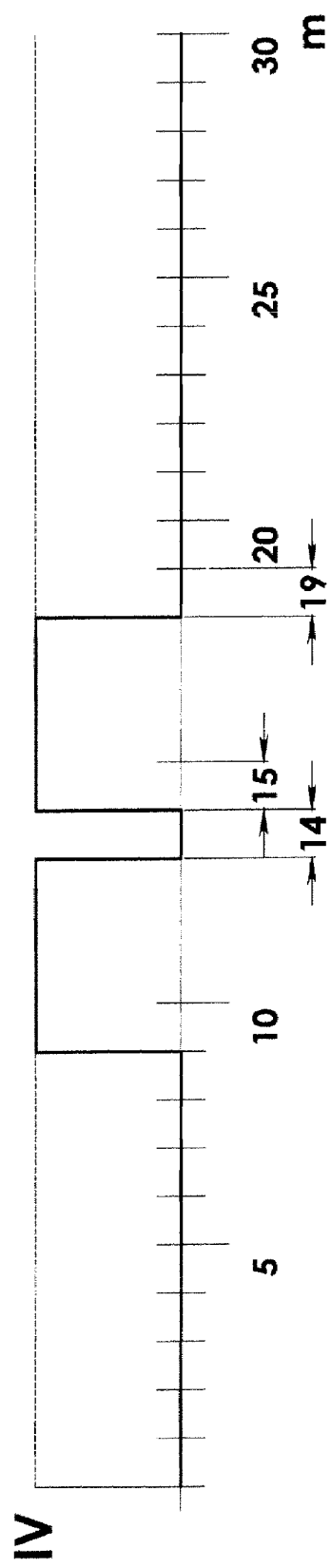

Referring to FIG. 1F, the scan cells (1'13), (1'15) generate a high logic signal, respectively, and the other scan cells generate a lower logic signal for the first scanning line (I) in the column direction in FIG. 1D. FIG. 1G illustrates the scan line data obtained for the second scanning line (II) in the column direction. FIG. 1H illustrates the scan line data obtained for the first scanning line (IV) in the row direction. In view of the unique features of fingerprints, if the card holder is different from the assigned user, the fingerprint scan data will differ from the fingerprint reference data.

As shown in FIG. 1E, the fingerprint sensor versus the one in the FIG. 1D can reduce number of column sector cells such as 8 to reduce the cost. The user need to press and "Swipe" up and down thru the surface of the fingerprint sensor. The firmware of the processing unit will reconstruct the virtual image of the fingerprint shown in FIG. 1D thru many snap shots of the fingerprint sensor. The multi line of the "swipe" sensor is for the purpose of compensating the different swiping speed of the holder of the card body.

Referring back to FIG. 1A, processing unit receives the fingerprint scan data from the fingerprint sensor, and compares the fingerprint scan data with the fingerprint reference data in the memory device to verify if the holder of the card body is the assigned user. The processing unit activates the interface circuit for exchanging the card information with the host computer via communication link upon verifying that the holder of the card body is the assigned user. Thus, the integrated circuit card cannot be used if the card holder is not the assigned user.

The card information can be selected via a function key set and a display of the host computer. For example, when the function key set is selected in a credit card mode, the card information exchanged with the host computer includes the credit card number. Preferably, a segment of the fingerprint reference data stored in the memory device is transmitted by the processing unit to the host computer upon verifying that the holder of the card body is the assigned user for increased security of network transaction. The segment of the fingerprint reference data includes chosen ones of the scan line data selected according to date or time of the exchange of the card information with the host computer. Alternatively, the chosen ones of the scan line data can be selected in a random manner.

According to certain embodiments of the invention, an integrated circuit card adapted is capable of establishing a communications link with a host computer. In one embodiment, an integrated circuit card includes a card body, a memory device mounted on the card body for storing fingerprint reference data obtained by scanning a fingerprint of an assigned user, and for storing card information. The integrated circuit card further includes a fingerprint sensor mounted on the card body and adapted to scan a fingerprint of a holder of the card body and to generate fingerprint scan data and a processing unit mounted on the card body and connected to the memory device. The processing unit receives the fingerprint scan data from the fingerprint sensor and compares the fingerprint scan data with the fingerprint reference data in the memory device to verify if the holder of the card body is the assigned user. The processing unit activates the input/output interface circuit for exchanging the card information with the host computer to verify that the holder of the card body is the assigned user.

The fingerprint reference data includes various scan line data, where each of which describes fingerprint characteristics in a respective scanning line of the fingerprint of the assigned user.

The fingerprint sensor includes an m×n array of scan cells that defines a fingerprint scanning area. The fingerprint scan data includes a plurality of scan line data obtained by scanning corresponding lines of the array of scan cells. The lines of the array of scan cells are scanned either in a row direction of the array in a column direction of the array. Each of the scan cells generates a first logic signal upon detection of the ridge in the fingerprint of the holder of the card body, and a second logic signal upon detection of a valley in the fingerprint of the holder of the card body. The memory device may be a flash memory.

The scan line data of the fingerprint reference data is of a fingerprint scanning area having columns and rows from the scanned fingerprint of the assigned user, and each scan line data is numbered. Each numbered scan line data corresponds to a line selected from the group consisting of an even scanning line in the column direction of the fingerprint scanning area, an odd scanning line in the column direction, an even scanning line in the row direction, and an odd scanning line in the row direction.

Since the electronic data storage compares fingerprint scan data obtained by scanning a fingerprint of a user of the device with the fingerprint reference data in the memory device to verify if the user is the assigned user, the electronic data storage can only be used by the assigned user so as to reduce the risks involved when the electronic data storage is stolen or misplaced.

Figure 2A:
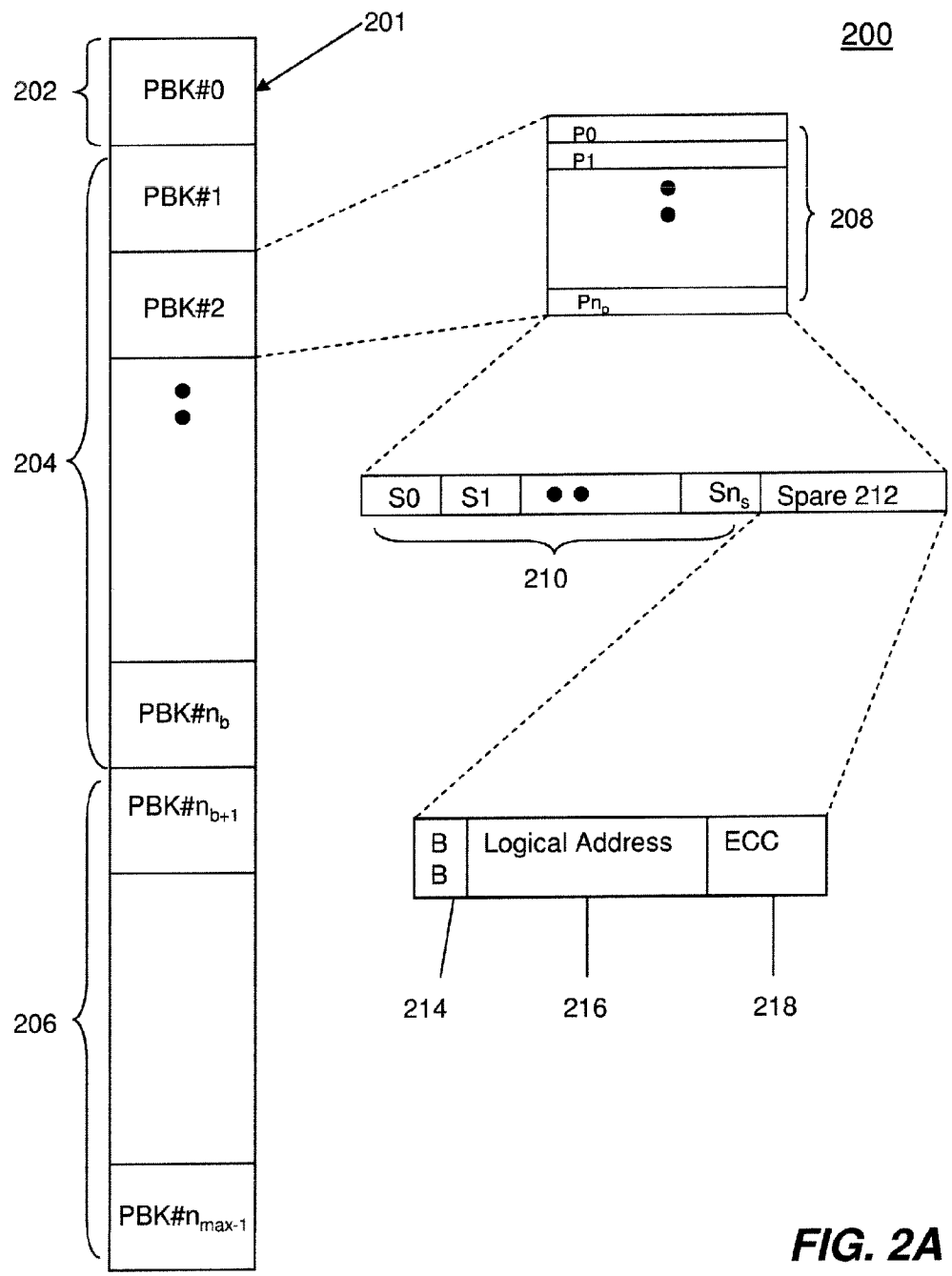
FIG. 2A is a diagram depicting a data structure of an exemplary large capacity flash memory, according one embodiment of the present invention.

Referring now to FIG. 2A, which is a diagram depicting an exemplary data structure 200 of a flash memory module 201 (e.g., flash memory module 103 of FIG. 1C) in accordance with one embodiment of the present invention. The flash memory module 201 is divided into a plurality of physical blocks e.g., PBK#0, PBK#1, PBK#2, . . . ). In general, there are three categories of physical blocks: 1) the first block 202 (i.e., PBK#0); 2) normal usage data blocks 204 (i.e., PBK#1, PBK#2, . . . , PBK#$n_b$); and 3) reserved blocks 206 (i.e., PBK#$n_{b+1}$, . . . PBK#$n_{max-1}$). The first block (PBK#0) 202 is guaranteed to be a good block and used by the manufacturer to store certain information such as Flash Timing Parameter (FTP), and other information by Initial Manufacturing Program (IMP), which cannot be alter by users. The manufacturer may define a percentage (e.g., 95%) of the total capacity as normal usage data blocks and the rest as reserved. The normal usage data blocks 204 are configured for user to store user data, although the first block (i.e., PBK#1) of the normal usage data blocks 204 is generally used for storing Master Boot Record (MBR), which contains critical data for operation of a computing device. Lastly, the reserved blocks 206 are configured to be accessed by a program module (e.g., FW) via special memory addresses in accordance with one embodiment of the present invention. Examples of the special memory address are 0xFFFF0000, 0xFFFF0001, 0xFFFFFF00, 0xFFFFFF01, etc.

Each block is further divided into a plurality of pages 208 (e.g., P0, P1, . . . , Pn$_p$). Each of the pages 208 includes a data area 210 and a spare area 212. The data area is partitioned into a plurality of sectors (e.g., S0, S1, . . . , Sn$_s$). In one embodiment, each sector stores 512-byte of data. The spare area 212 is configured to provide three different fields: 1) a block indicator (BB) 214, a logical address area 216 and an error correction code (ECC) area 218. When a block is tested no good by the manufacturer, the block indicator 214 of that block is set to a special code to indicate a bad block that cannot be used. The logical address area 216 is configured for identifying of that particular physical block for initialization of the flash memory device. More details are described in FIG. 4E and FIG. 4F for the reserved physical blocks as used by an embodiment of the present invention. Detailed processes of initialization are shown in FIGS. 7A-7E. The ECC area 218 is configured to store the ECC for ensuring data integrity.

In order to access the data stored in the normal usage blocks 204 of the flash memory module 201, the host computing device 109 transmits a data transaction request (e.g., data read or write) along with a logical sector address (LSA) to the flash memory device (e.g., flash memory device 140 of FIG. 1C). The processing unit 102 of the flash memory device converts the received LSA into a physical address (i.e., specific block, page and sector numbers) before any data transaction can be performed. Traditionally, the conversion is performed by an address look up table with a one-to-one relationship to the physical address. This solution works for a flash memory device with relatively small capacity, because the address look up table is implemented with a static random access memory (SRAM). It would not be feasible in terms of cost and physical space to include SRAM that grows linearly as the capacity of the flash memory device especially for a large capacity MLC based flash memory device. For example, a large capacity (say 32 Giga-Byte (GB)) MLC based flash memory device using 2112-byte page (i.e., 2048-byte data plus 64-byte spare) and 128 pages per block, it would require more than 2 MB bytes of SRAM to hold the entire address look up table.

Figure 2B:
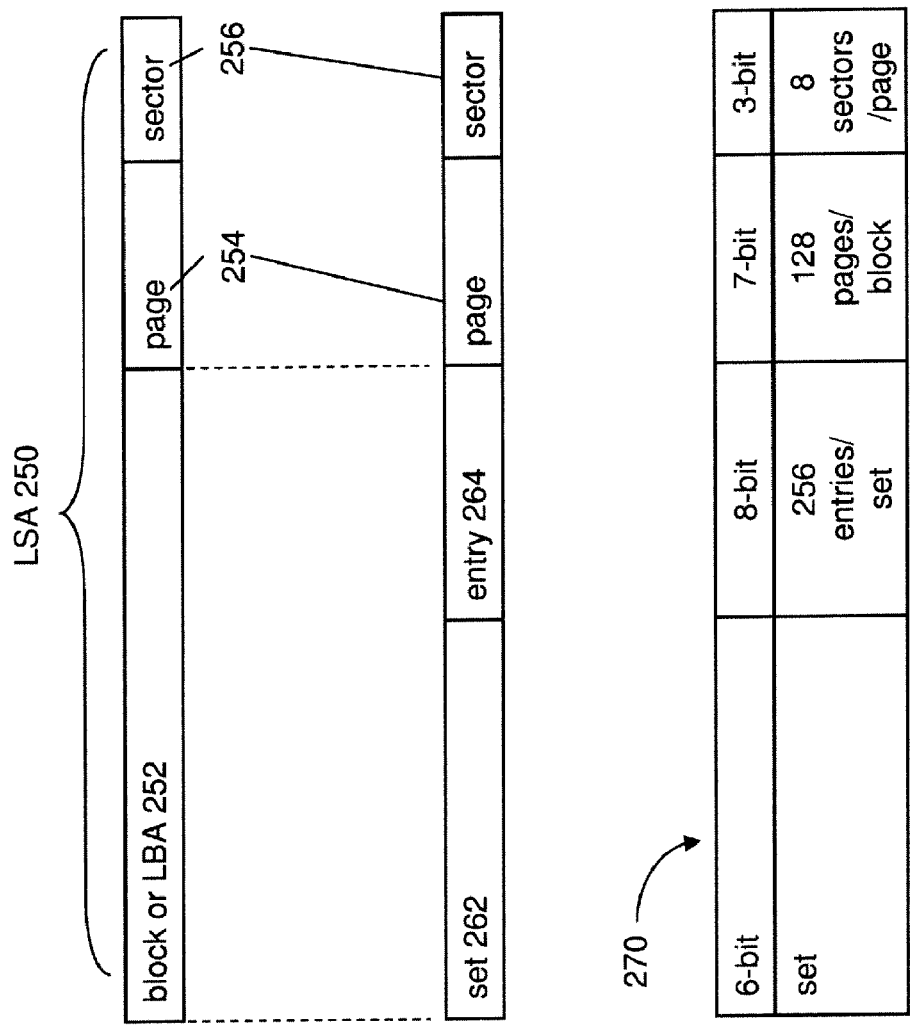
FIG. 2B is a diagram showing an exemplary scheme for partitioning a logical sector address in accordance with one embodiment of the present invention.

FIG. 2B is a diagram showing an exemplary scheme for partitioning a logical sector address in accordance with one embodiment of the present invention. A logical sector address (LSA) 250 is traditionally partitioned as three parts: block 252, page 254 and sector 256. The block portion 252 is also referred to as logical block address (LBA). According to one aspect of the present invention, the LSA 250 is partitioned into four parts: set 262, entry 264, page 254 and sector 256. The page 254 and sector 256 remain the same. And the block 252 is further partitioned into two parts: the set 262 and the entry 264. In other words, instead of just using block 252 as basic unit, the blocks are divided into a plurality of sets 262. Each of the sets 262 includes a plurality of entries 264. For example, if a 24-bit LSA 270 is partitioned in the following manner: 6-bit for set, 8-bit for entry, 8-bit for page and 3-bit for sector, the LSA 270 could represent up to 64 sets of 256 entries (i.e., 16,384 blocks) with each block containing 128 pages and each page containing 8 sectors of 512-byte of data. In this document, the number of the plurality of sets is N, where N is a positive integer.

To carry out the address partition scheme of the present invention, the manufacturer may predefine number of sets and entries in the first physical block (i.e., PBK#0) by the IMP. Instead of mapping all of the logical sector addresses (LSA) to a physical address in a memory, only a portion of the LSA (i.e., a set) is included such that only a limited size of memory is required for address correlation and page usage information. In other words, a limited size memory is configured to hold one set of entries with each entry including an address of the corresponding physical block and a plurality of corresponding page usage flags (see FIG. 4A for details). For example, 18-byte (i.e., 2-byte for the physical block address plus 128-bit or 16-byte for 128 page usage flags) is required for each entry, hence a total of 4608-byte of memory is required for a set with 256 entries.

However, in order to correlate a logical block address to a unique physical block, every entry in each of the plurality of sets must correlate to a unique physical address and a set of page usage flags. Since the limited size memory only has capacity of holding one set of such information, an embodiment of the present invention requires that information of all of the plurality of sets be stored in reserved area 206 of the flash memory 201. Only a relevant set of the plurality of sets is loaded into the limited size memory in response to a particular data transfer request from a host computing system 109. The relevant set is defined as the set with one of the entries matches the entry number derived from the LSA associated with the received data transfer request.

Since there are N sets of address correlation and page usage information stored in the flash memory, each of the N sets is referred to as a partial logical-to-physical address and page usage information (hereinafter 'PLTPPUI') appended with a set number (e.g., 'PLTPPUI0', 'PLTPPUI1', . . . 'PLTPPUIN').

In order to simplify the examples and drawings in the Specification, an example with small numbers is used for demonstrate the relationship between LSA, LBA, sector, page, entry and set numbers. Those of ordinary skill in the art will understand implementation of an embodiment of the present invention can be with larger numbers. The following example uses a flash memory with four sectors per page, four pages per block and four entries per set and a logical sector address 159 (i.e., LSA=159) is represented by a binary number "10 01 11 11". As a result, the least significant four bits of LSA represent sector and page numbers with the two lowest bits for the sector number and the next two for the page number, as each two-bit represents four distinct choices—0, 1, 2 and 3. After truncating the four least significant bits of LSA, the remaining address becomes the corresponding logical block address (LBA). In this example, LBA has a binary value of '1001'. Because there are four entries per set in this example, two least significant bits of LBA represent the entry number (i.e., offset number in each set). The remaining high bits of LBA represent the set number. A summary of this example is listed in Table 1.

TABLE 1

| 10 | 01 | 11 | 11 |
|---|---|---|---|
| Set Number | Entry Number | Page Number | Sector Number |

According to one aspect of the present invention, an indexing scheme enables the processing unit 102 to translate logical sector addresses (LSAs) and/or logical block addresses (LBAs) provided, in conjunction with a data transfer request, by the host computing device 109 to physical block numbers or addresses (PBK#) in the flash memory device 140. The indexing scheme comprises a plurality of sets of PLTPPUI and physical characteristics of the flash memory such as total number of sets, entries, pages and sectors. And ratios among the set, entry, page and sector. The processing unit 102 can utilize the indexing scheme to determine which sectors of the flash memory are available for each particular data transfer request.

Figure 3:
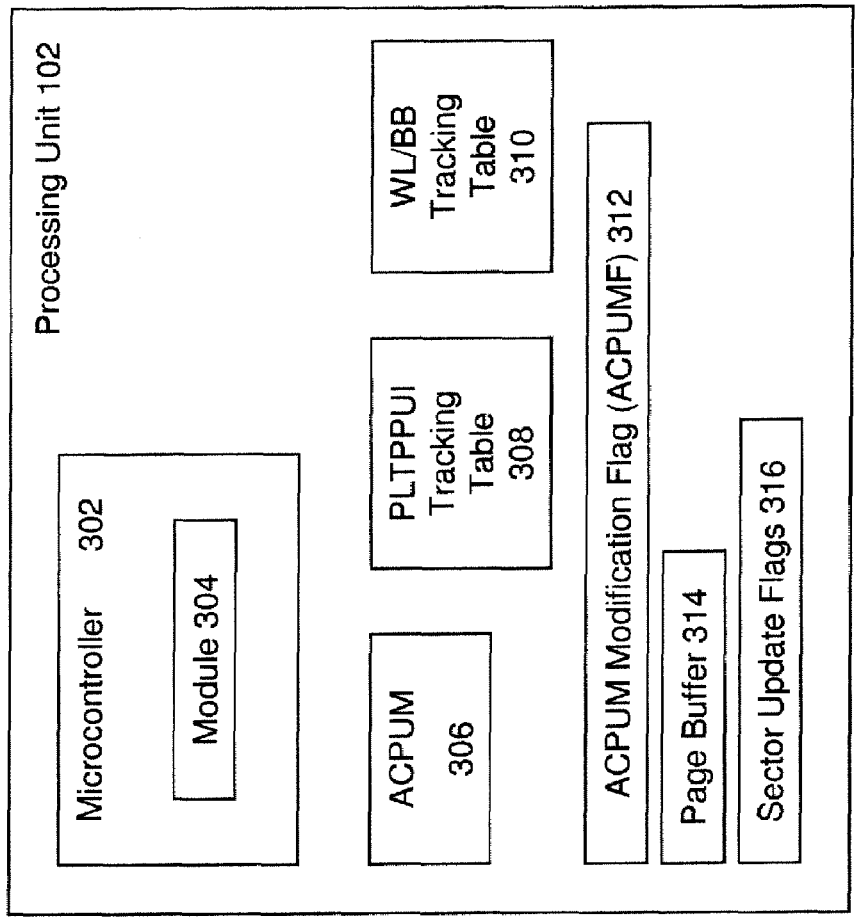
FIG. 3 is a simplified block diagram illustrating salient components of an exemplary processing unit of each of the electronic flash memory devices of FIGS. 1A-1C, according to an embodiment of the present invention.
Figure 4A:
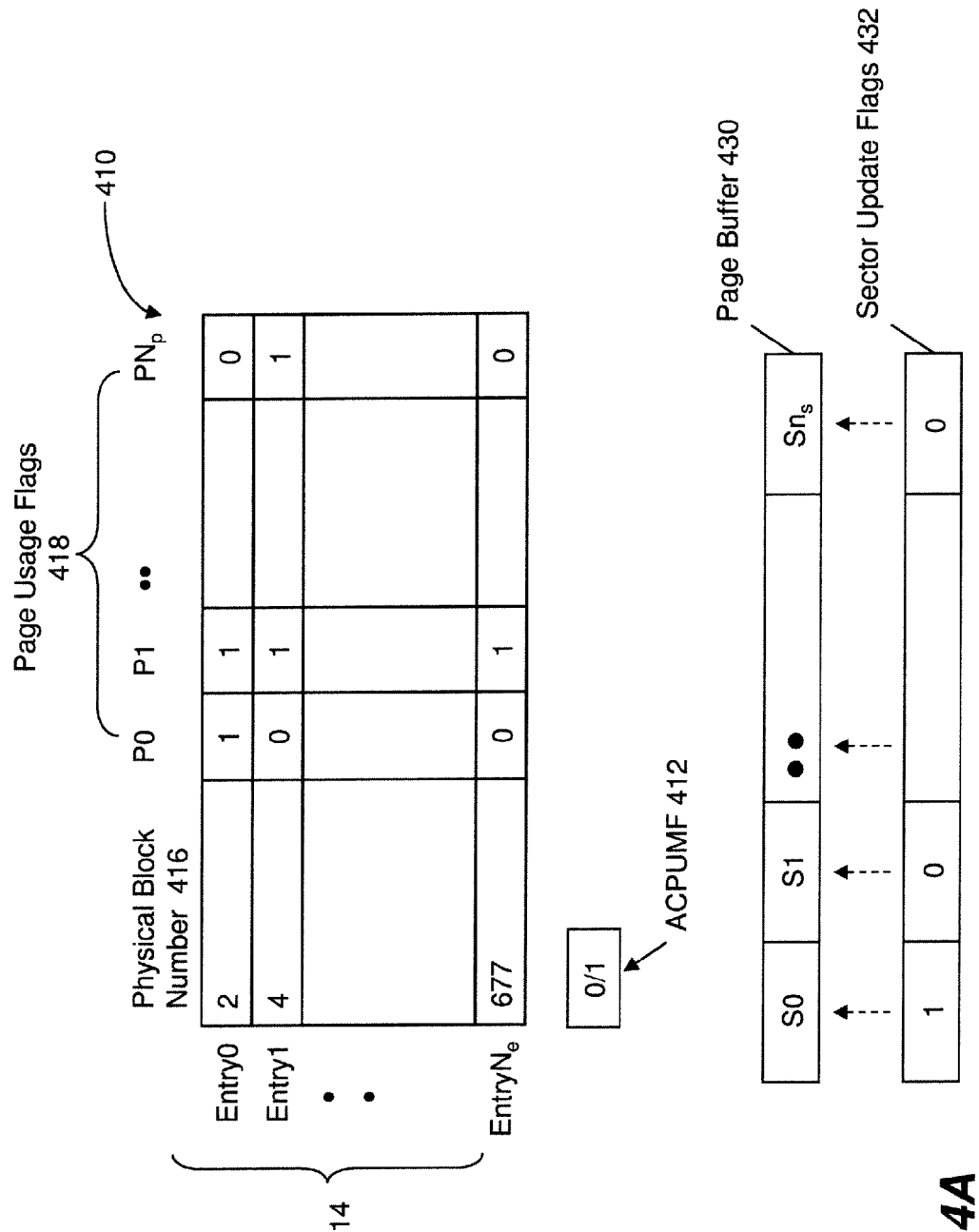
Figure 4B:
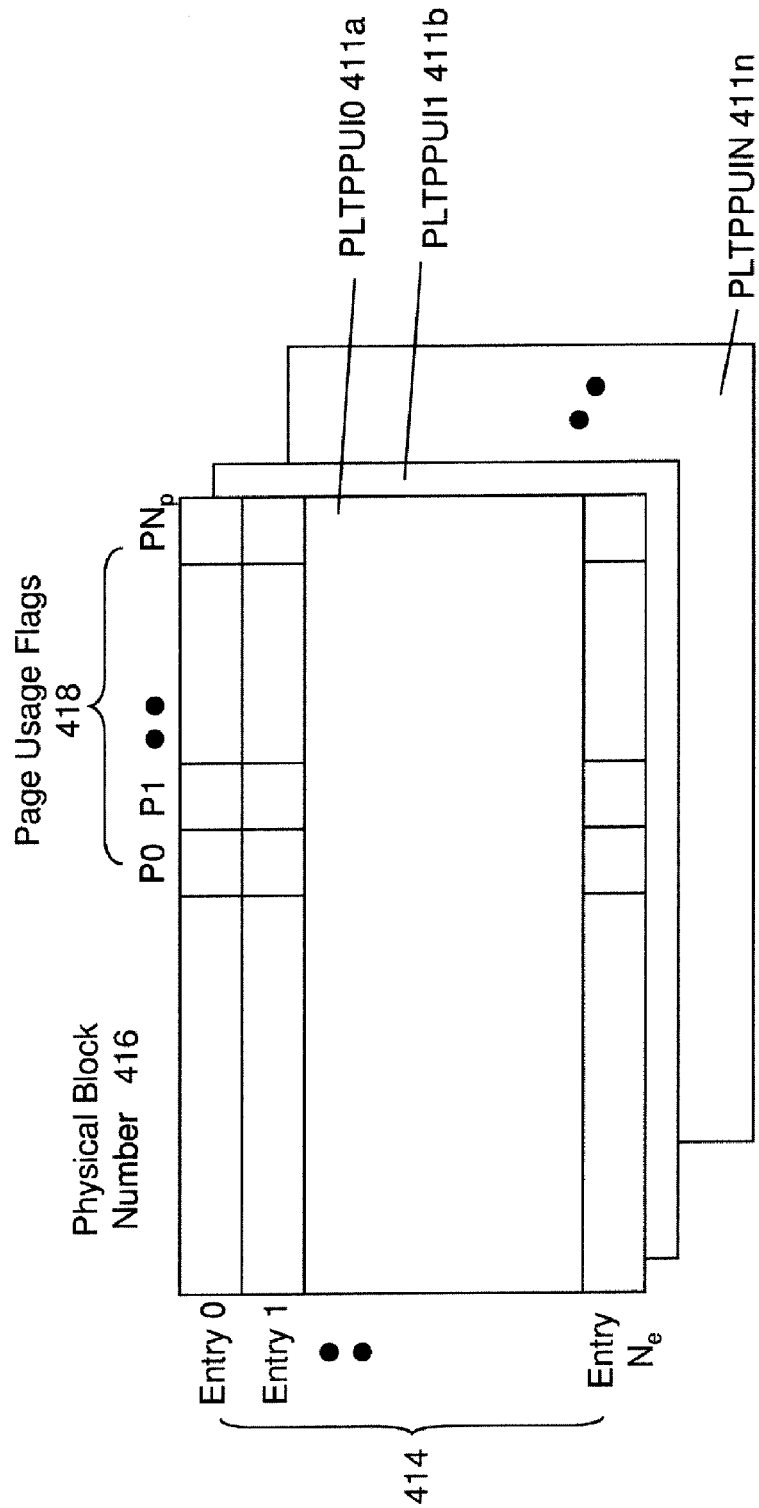

FIG. 3 is a simplified block diagram showing salient components of the process unit 102 of an electronic flash memory device (e.g., flash memory devices 102 of FIG. 1C) in accordance with one embodiment of the present invention. The processing unit 102 comprises a microcontroller or microprocessor 302, an address correlation and page usage memory (ACPUM) 306, a PLTPPUI tracking table 308, a wear leveling and bad block (WL/BB) tracking table 310, a ACPUM modification flag (ACPUMF) 312, a page buffer 314 and a set of sector update flags 316.

The microcontroller 302 with a flash memory controlling program module 304 (e.g., a firmware (FW)) installed thereon is configured to control the data transfer between the host computing device 109 and the at least one flash memory module 103. The ACPUM 306 is configured to provide an address correlation table, which contains a plurality of entries, each represents a correlation between a partial logical block address (i.e., entries) to the corresponding physical block number. In addition, a set of page usage flags associated with the physical block is also included in each entry. The ACPUM 306 represents only one of the N sets of PLTPPUI, which is stored in the reserved area of the flash memory. In order to keep tracking the physical location (i.e., physical block number) of each of the N sets of PLTPPUI, the physical location is stored in the PLTPPUI tracking table 308. Each item is the PLTPPUI tracking table 308 corresponds a first special logical address to one of the N sets of PLTPPUI. The wear leveling counters and bad block indicator for each physical block is stored in a number of physical blocks referred by corresponding second special logical addresses (e.g., '0xFFFFFF00'). The WL/BB tracking table 310 is configured to store physical block numbers that are assigned or allocated for storing these physical block wear leveling counters and bad blocks. The ACPUM modification flag (ACPUMF) 312 is configured to hold an indicator bit that tracks whether the ACPUM 306 has been modified or not. The page buffer 314 is configured to hold data in a data transfer request. The page buffer 314 has a size equaling to the page size of the flash memory 201. The sector update flags 316 are configured to hold valid data flag for each of the corresponding sectors written into data area of the page buffer 314. For example, four sector update flags are be required for a page buffer comprising four sectors. The page buffer 314 also includes a spare area for holding other vital information such as error correction code (ECC) for ensuring data integrity of the flash memory.

FIGS. 4A-4F collectively show exemplary data structures used for managing memory addresses of the flash memory of FIG. 2A in accordance with one embodiment of the present invention. The ACPUM data structure 410 contains $N_e$ rows of entries 414, where $N_e$ is a positive integer. Each row contains a physical block number or address (PBK#) 416 and a plurality of page usage flags 418 associated with the PBK#. The number of pages ($N_p$) is determined by the physical flash memory cell structure and defined by the IMP. ACPUMF 412 contains one bit, which is a toggle switch representing whether the ACPUM 306 has been modified or not. The ACPUMF 412 may be implemented as a register containing either 0 (not modified) or 1 (modified). The page buffer 430 includes a data area containing plurality of sectors (S1, S2, . . . , $Sn_s$) and a spare area (not shown in FIG. 4A) containing other information such as ECC. A set of sector update flags 432 is configured to represent respective sectors in the page buffer 430. Each of the sector update flags 432 indicates either a corresponding sector contains a valid data or not. In one implementation, valid data is represented as "1", while initial or stale state as "0". These flags may be implemented in a different logic such as reversing the binary representation. As discussed in the prior sections and shown in FIG. 4B, there are N sets of PLTPPUI 411a-n, where N is a positive integer. The N sets of PLTPPUI 411a-n represent all of the logical blocks in correlation with physical blocks. Only one of the N sets is loaded into the ACPUM 306 at one time.

Each set of the PLTPPUI is stored in the reserved area 206 of the flash memory 201 of FIG. 2A in a data structure 420 shown in FIG. 4C. The contents of each set of PLTPPUI are stored in one page of a physical block. For example, the PLTPPUI0 is stored at one of a plurality of first special logical addresses "0xFFFF0000", which corresponds to the first page (P0) 424a of a physical block 'PBK#1000' 422 initially. Due to the MLC flash memory data programming rules, each page can only be programmed or written once (i.e., NOP=1) and data programming within one block can only be in a ascending page order. The second data programming or write can only be into the second page (P1) 424b until the $n^{th}$ write to the last page (Pn) 424n of the block 'PBK#1000' 422. After that, the next data programming, the $(n+1)^{th}$ write, must be written to the first page (P0) 434 of a new physical block (PBK#1012) 432 just assigned or allocated according to the WL rules. In storing ACPUM 306 into the flash memory, each entry of the ACPUM 306 is written sequentially in the data area 425 of the page. When a first page of a new block is programmed, after the data area has been written, other vital information is written into the spare area 426. The other information include at least the following: a bad block indicator 427, the special logical address 428 issued by the FW for each of the N sets of PLTPPUI and a tracking number 429 for each special logical address. The bad block indicator 427 showing 'FF' means a good block. The first special logical address 442 may be '0xFFFF0000'. And the tracking number (TN) 446 is set to zero for an initial physical block corresponding to each of the first special logical addresses. The tracking number 446 is incremented by one as a new block is assigned or allocated for storing a particular set of PLTPPUI.

FIG. 4D is a diagram illustrating an exemplary data structure 440 of the PLTPPUI tracking table 308 of FIG. 3. The PLTPPUI tracking table 308 contains a plurality of rows representing a plurality of first special logical addresses 442, one for each of the N sets of PLTPPUI. Each of the N rows contains a physical block number 444, a tracking number (TN) 446 and highest page number 448. The first row of the PLTPPUI tracking table 308 corresponds to the example shown in FIG. 4C.

Similar to the data structure of the PLTPPUI tracking table, an exemplary data structure 450 of a WL/BB tracking table 310 is shown in FIG. 4E. Instead of first special logical addresses for each of the N sets of PLTPPUI, each row is for a second special address 452 of a block of the WL/BB tracking table 310. In one implementation, the second special address 452 may be '0xFFFFFFF0'. An exemplary data structure 460 for storing the WL/BB tracking table in the reserved area of a flash memory is shown in FIG. 4F. Similarly, the MLC flash memory data programming rules dictate the data to be written to a new page for each update. The spare area stores the block indicator 467, the second special logical address 452 and tracking number 456.

Referring now to FIGS. 5A-5E, which collectively show a flowchart illustrating an exemplary process 500 of conducting data transfer requests of the flash memory of FIG. 2A in accordance with one embodiment of the present invention. The process 500 is preferably understood in conjunction with previous figures and examples shown in FIGS. 6A-6D. The process 500 is performed by the microcontroller 302 with a flash memory controller program module 304 installed thereon.

The process 500 starts in an 'IDLE' state until the microcontroller 302 receives a data transfer request from a host (e.g., the host computing device 109 of FIG. 1C) at 502. Also received in the data transfer request is a logical sector address (LSA), which indicates the location the host wishes to either read or write a sector of data (i.e., 512-byte sector). Based on the parameters defined by the IMP and the physical characteristics of the MLC based flash memory, the received LSA is processed to extract the set, entry, page and sector numbers (see Table 1 for an example) included therein. After the received LSA has been processed, the process 500 moves to decision 504. It is determined whether the ACPUM 306 has been loaded with a set of PLTPPUI that covers the received LSA. If 'yes', the process 500 reads out the physical block number (PBK#) corresponding to the entry number of the received LSA at 516 before moving to another decision 518, in which it is determined whether the data transfer request is read or write (i.e., program).

If the decision 504 is 'no', the process 500 moves to decision 506. The process 500 checks whether the contents of the page buffer 430 need to be stored. In one implementation, the process 500 checks the sector update flags 432 that correspond to sectors in the page buffer 430. If any one of the flags 432 has been set to 'valid', then the contents of the page buffer 430 must be stored to the corresponding page of the corresponding physical block of the MLC flash memory at 550 (i.e., the decision 506 is 'yes'). Detailed process of step 550 is shown and described in FIG. 5D. After the contents of the page buffer 430 have been stored, the process 500 sets the ACPUM modification flag (ACPUMF) 412 to a 'modified' status at 508. In other words, the ACPUM 306 has been modified and needs to be stored in the flash memory in the future. Then the process 500 moves to yet another decision 510.

Otherwise if 'no' at decision 506, the process 500 moves the decision 510 directly. It is then determined if the ACPUM 306 has been modified. If 'yes', the process 500 moves to 580, in which the process 500 writes the contents of the ACPUM 306 to one of a plurality of first special logical addresses (e.g., '0xFFFF0000' for PLTPPUI0, or '0xFFFF0001' for PLTP-PUI1, etc.) for storing corresponding set of PLTPPUI in the reserved area of the flash memory. The ACPUM modification flag 412 is reset at the end of 580. Detailed process of step 580 is shown and described in FIG. 5E. Then, at 514, the process 500 loads a corresponding set of PLTPPUI to the ACPUM 306 from the flash memory based on the set number extracted from the received LSA. Once the ACPUM 306 has been loaded, the process 500 reads the physical block number that corresponds to the entry number at 516 before moving to decision 518. If 'no' at decision 510, the process 500 skips step 580 and goes directly to 514.

Figure 5A:
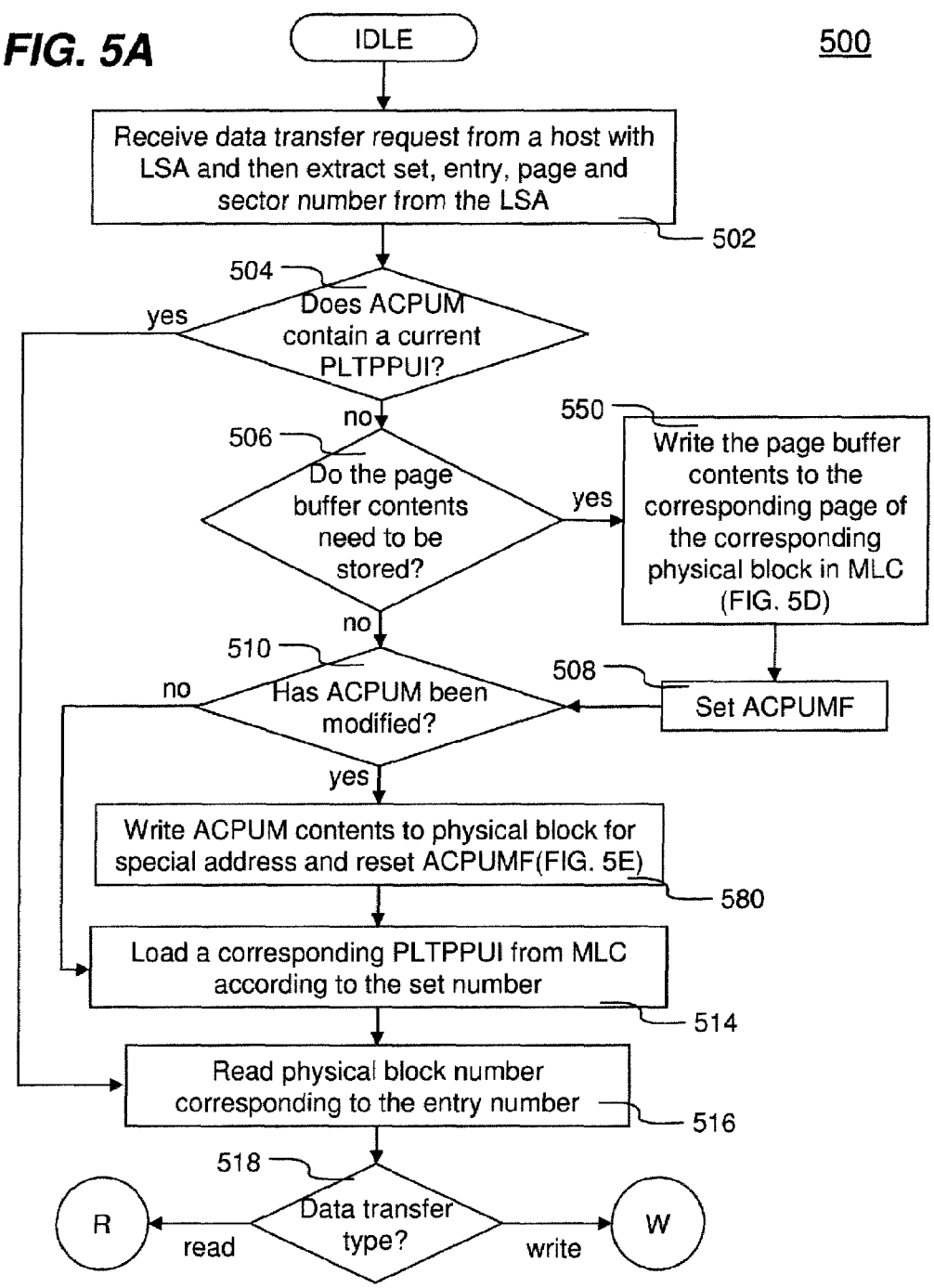
Figure 5B:
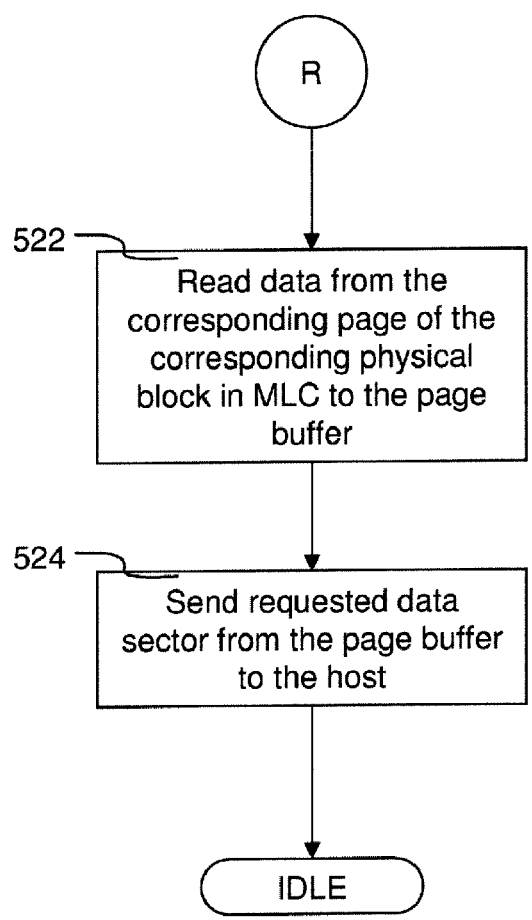

Next, at decision 518, if the data transfer request is a data read request, the process 500 continues with a sub-process 520 shown in FIG. 5B. The process 500 or sub-process 520 reads data from the corresponding page of the physical block in the flash memory to the page buffer 430. The corresponding page number is derived from the received LSA, and the physical block number is obtained through the ACPUM 306 for the entry numbers at 516. Finally, the process 500 sends the requested data sector from the page buffer 430 to the host 109 before going back the 'IDLE' status waiting for another data transfer request.

If the data transfer request is a data write or program request, the process 500 continues with a sub-process 530 shown in FIG. 5C. The process 500 or sub-process 530 moves to decision 532, in which it is determined whether the contents of the page buffer 430 have been modified. If 'no', the process 500 writes received data sector into the page buffer 430 according to the sector number derived from the received LSA, and marks the corresponding sector of the sector update flags 432 to indicate valid data in that particular sector has been written in the page buffer 430 at 538. The process 500 then moves back to the 'IDLE' state waiting for another data transfer request.

If 'yes' at decision 532, the process 500 moves to decision 534. It is determined if the received data sector is in the same entry and page numbers. If 'yes', the process 500 writes the received data sector to the page buffer 430 at 538 before going to the 'IDLE'. If 'no' at decision 534, the process 500 writes the page buffer contents to the corresponding page of the physical block of the flash memory at 550. Next, the process 500 sets the ACPUM modification flag 412 to a 'modified' status at 536. Next, at 538, the process 500 writes the received data sector to the page buffer before going back to the 'IDLE' state.

Finally, in additional to managing data read and write requests, the process 500 regularly performs a background physical block recycling process so that the blocks containing only stale data can be reused later. When the process 500 is in the 'IDLE' state, it performs test 540, in which it is determined if the idle time has exceeded a predefine time period. If 'yes', the process 500 performs the background recycling process, which may include issuing a dummy data write request to force the page buffer 430 and/or modified ACPUM 306 to be written to corresponding locations of the flash memory at 542. In one embodiment, the dummy data write/program command may be issued to rewrite some of seldom touched physical blocks, for example, physical blocks used for storing user application or system program modules.

Figure 5D:
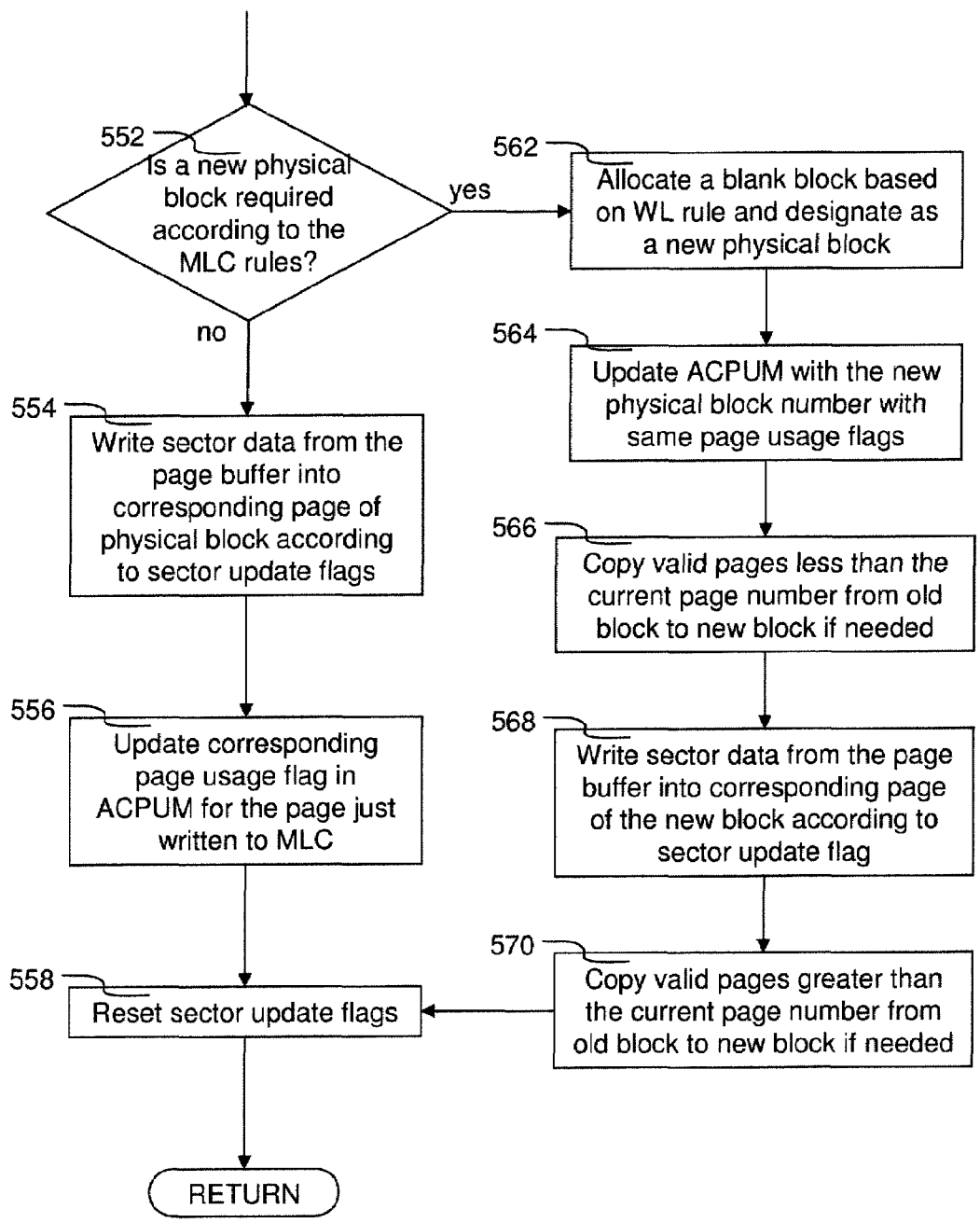

Referring to FIG. 5D, a detailed process of step 550 is shown. First, the process 500 is at decision 552, in which it is determined if a new blank physical block is required for storing the contents of the page buffer 430 based on the MLC based flash memory data programming rules. The rules are as follows: 1) each page can only be programmed once (conventionally referred to as 'NOP=1'); and 2) data programming is performed to a page of a same block in the ascending or sequential order, or each new page must have a high page number in the same block. If 'no' at decision 552, the process 500 writes valid data sectors based on the sector update flags 432 from the page buffer 430 to the page register of the corresponding page of the corresponding physical block of the flash memory at 554. Next, at 556, the process 500 updates the corresponding one of the page usage flags in the ACPUM 306 for the page just written to the flash memory. The process 500 then resets the sector update flags at 558 before returning.

If 'yes' at decision 552, the process 500 searches for a blank physical block based on the wear leveling (WL) rule; once found, the process 500 designates it as a new block at 562. Then, the process 500 updates the ACPUM 306 with the new physical block number for the entry number and keeps the page usage flags the same. It is noted that the entry number is derived from the received LSA. Next, at 566, the process 500 copies all valid pages with page number less than the current page number from the old to the new physical block if needed. The current page number if the page number derived from the received LSA. Then, the process 500 writes the valid data sectors based on the sector update flags 432 from the page buffer 430 to the page register of the corresponding page of the new physical block at 568. Finally if necessary, the process 500 copies all valid pages with page number greater than the current page number from the old to the new physical block at 570. The process 500 resets the sector update flags at 558 before returning.

Figure 5E:
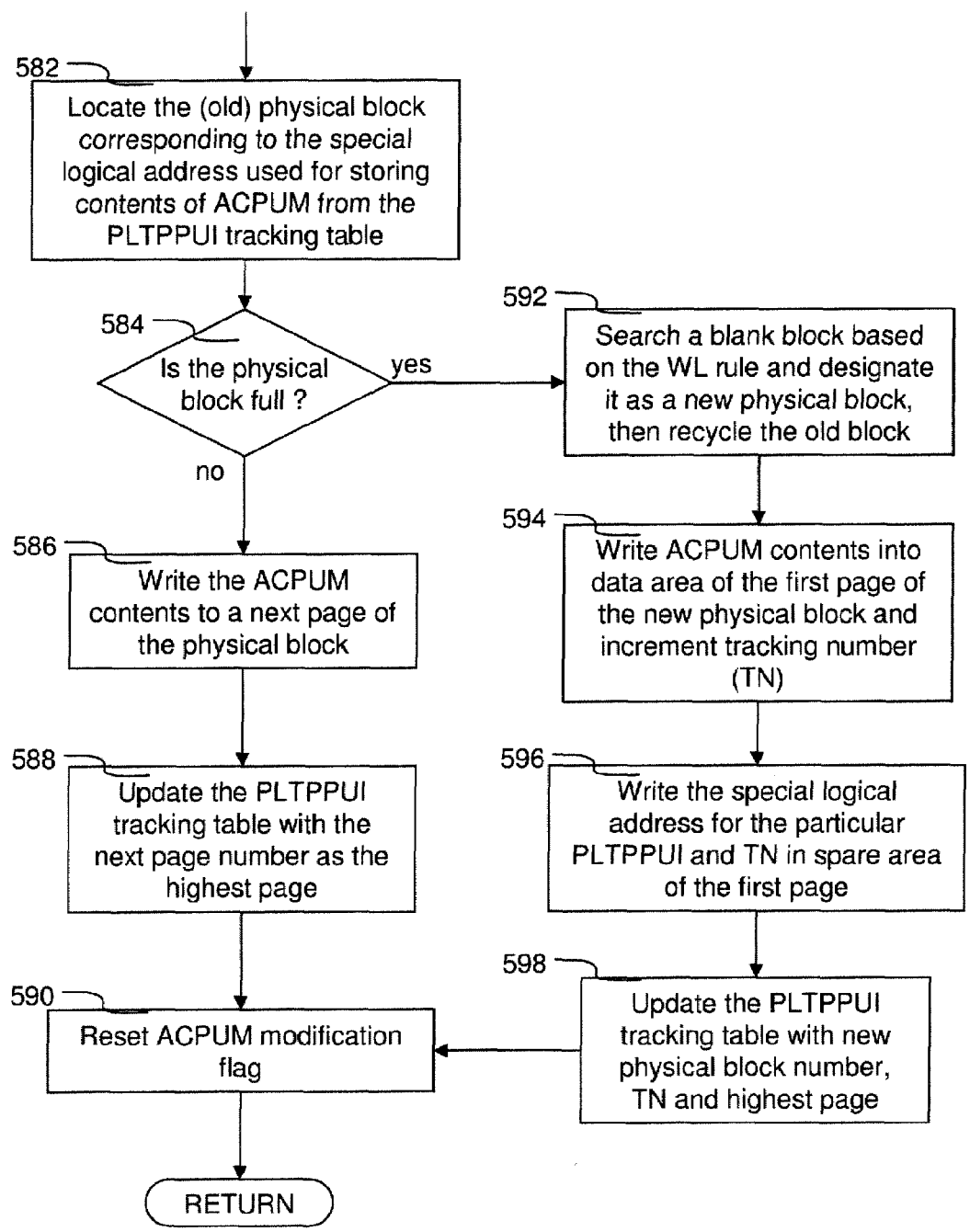

FIG. 5E is a flowchart illustrating step 580 of the process 500. First, in step 580, the process 500 locates the corresponding physical block in the reserved area of the flash memory using a particular one of the first special logical addresses from the PLTPPUI tracking table 308. The corresponding physical block is configured to store the contents of the current ACPUM 306, which is associated with the first special logical address, for example, '0xFFFF0000' for 'PLTPPUI0', '0xFFFF0001' for 'PLTPPUI1', etc. Next, at decision 584, it is determined whether the physical block is full or not. If 'no', the process 500 writes the contents of the ACPUM 306 to the next page in the physical block at 586. It is noted that the MLC based flash memory data programming rule dictates that only a new higher page in the same block is allowed to be programmed or written. Then the process 500 updates the PLT- PPUI tracking table 308 to reflect that a new page has been written into the physical block by incrementing the highest page count 448 at 588. Finally, before returning at 590, the process 500 resets the ACPUM modification flag 412 to a 'not modified' status as the contents of the ACPUM 306 have been stored to the flash memory.

Referring back to decision 584, if 'yes', the process 500 searches a blank physical block as a new physical block (e.g., new physical block (PBK#1012) in FIG. 4C) in the reserved area of the flash memory based on the WL rule, and the old physical block (e.g. old physical block (PBK#1000) in FIG. 4C) is sent to a recycling queue for reuse at 592. Next, at 594, the process 500 writes the contents of the ACPUM 306 to the first page (e.g., 'P0' of FIG. 4C) of the new block. After the contents of the ACPUM have been stored in to the data area of the first page, the tracking number (TN) is incremented by one. Next, at 596, the first special logical address for this particular set of PTLPPUI and the new tracking number (TN) are written into the spare area of the first page. The process 500 then updates the PLTPPUI tracking table 308 with the new physical block number, the tracking number and the highest page number for the current set of PLTPPUI at 598. Before returning, the process 500 resets the ACPUM modification flag 412 to a 'not modified' status at 590.

FIGS. 6A-6D collectively show a sequence of data write or program requests to demonstrate the exemplary process 500 of FIGS. 5A-5E. In order to simplify the drawings and description, the sequence of the data write requests is perform on an exemplary flash memory with four sectors per page, four pages per block, and four entries per set. As a result of the simplified assumption, the logical sector address (LSA) 602 received along with the data write request can be processed in a scheme corresponding to Table 1. In other words, two least significant bits of the LSA represent the sector number, next two the page number, next two the entry number, and the remaining bits the set number.

The sequence of the data write requests starts with (a) writing to LSA=0, which corresponds to set 0 (i.e., PLTP-PUI0), entry 0, page 0 and sector 0. PLTPPUI0 is loaded into ACUPUM 604, in which the first entry (i.e., entry 0) corresponds to physical block 'PBK#2' and page usage flags 606 are not set. The ACPUMF 614 is set to a 'un-modified' status. The sector data (S0) is written to the first sector of the page buffer 610 and the corresponding flag in the sector update flags 612 is set to a 'V' for valid data. The corresponding path in the process 500 for writing LSA=0 is as follows:
  receiving an LSA=0 and extracting set, entry, page and set numbers at 502;
  determining whether ACPUM contains a current set of PLTPPUI at 504 (yes, PLTPPUI0);
  reading physical block number (PBK#2) at entry 0 at 516;
  determining data transfer request type at 518 (write);
  determining whether page buffer contents have been modified at 532 (no);
  writing received data sector (S0) into the page buffer and marking corresponding sector ($1^{st}$) update flag at 538; and
  going back to 'IDLE' for next data transfer request.

The next data write request (b) is to write to LSA=1. The corresponding path is the process 500 is as follows:
  receiving an LSA=1 and extracting set, entry, page and set numbers at 502;
  determining whether ACPUM contains a current set of PLTPPUI at 504 (yes, PLTPPUI0);
  reading physical block number (PBK#2) at entry 0 at 516;
  determining data transfer request type at 518 (write);
  determining whether page buffer contents have been modified at 532 (yes);
  determining whether page and block number current at 534 (yes);
  writing received data sector (S1) into page buffer and marking corresponding sector ($2^{nd}$) update flag at 538; and
  going back to 'IDLE' for next data transfer request.

Figure 6A:
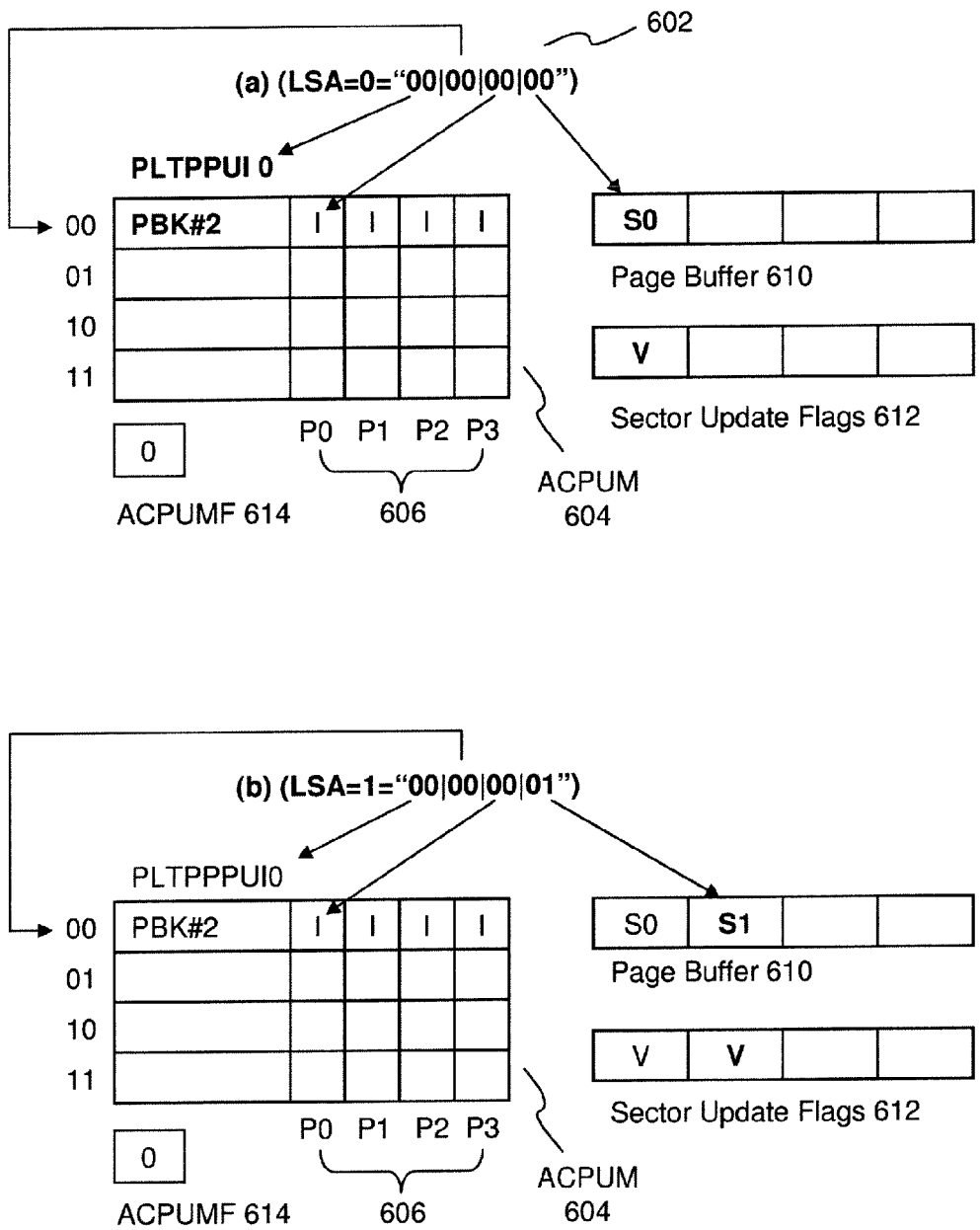
FIGS. 6A-6E collectively show a sequence of data write requests to demonstrate the exemplary process 500 of FIGS. 5A-5E.
Figure 6B:
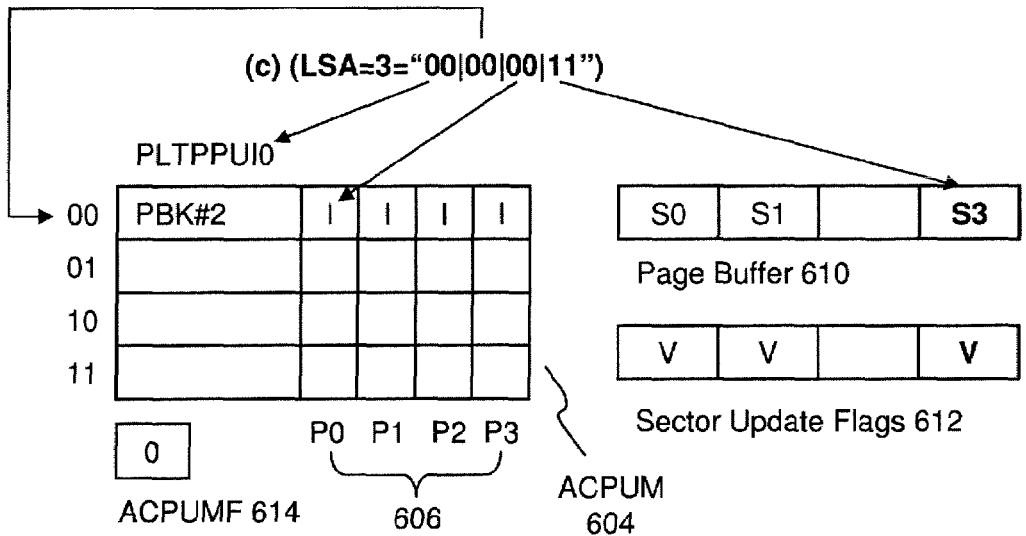
Figure 6B:
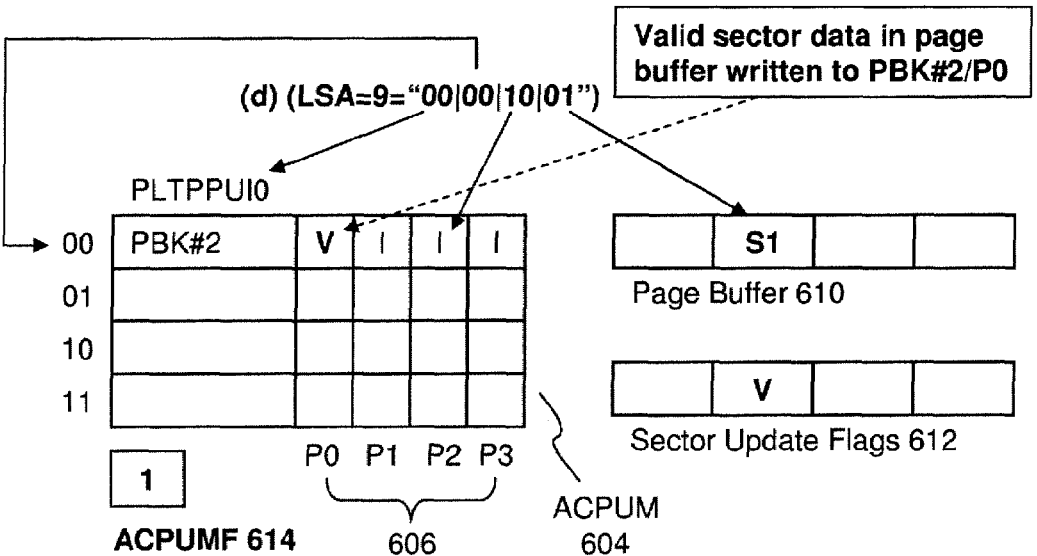

The next data write request (c) is to write to LSA=3 (FIG. 6B). The corresponding path is the process 500 is as follows:
  receiving an LSA=3 and extracting set, entry, page and set numbers at 502;
  determining whether ACPUM contains a current set of PLTPPUI at 504 (yes, PLTPPUI0);
  reading physical block number (PBK#2) at entry 0 at 516;
  determining data transfer request type at 518 (write);
  determining whether page buffer contents have been modified at 532 (yes);
  determining whether page and block number current at 534 (yes);
  writing received data sector (S3) into the page buffer and marking corresponding sector ($4^{th}$) update flag at 538; and
  going back to 'IDLE' for next data transfer request.

The next data write request (d) is to write to LSA=9 (FIG. 6B). The corresponding path is the process 500 is as follows:
  receiving an LSA=9 and extracting set, entry, page and set numbers at 502;
  determining whether ACPUM contains a current set of PLTPPUI at 504 (yes, PLTPPUI0);
  reading physical block number (PBK#2) at entry 0 at 516;
  determining data transfer request type at 518 (write);
  determining whether page buffer contents have been modified at 532 (yes);
  determining whether page and block number current at 534 (no, same block but different page);
  writing the page buffer contents to the corresponding page (first page of PBK#2) at 550, which includes determining a new block is required at 552 (no); writing sector data to the first page of PBK#2 at 554; updating at the corresponding page usage flag (P0) in ACPUM at 556 and resetting sector update flags at 558;
  setting the ACPUMF (i.e., 1 for 'modified') at 536; and
  writing received data sector (S1) into the page buffer and marking corresponding sector ($2^{nd}$) update flag at 538 before going back to "IDLE".

Figure 6C:
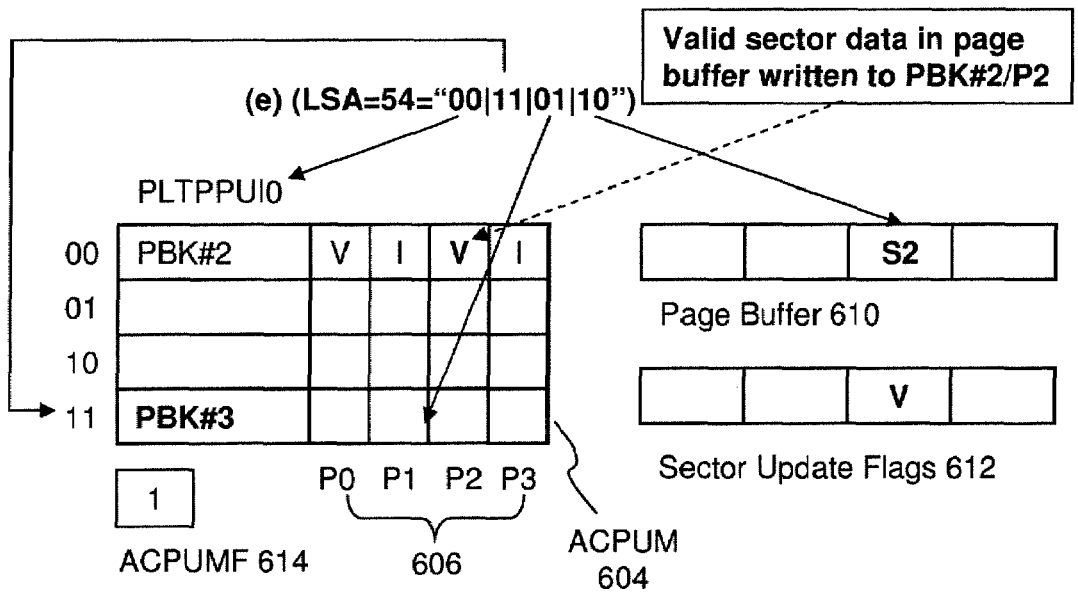

The next data write request (e) is to write to LSA=54 (FIG. 6C). The corresponding path is the process 500 is as follows:
  receiving an LSA=54 and extracting set, entry, page and set numbers at 502;
  determining whether ACPUM contains a current set of PLTPPUI at 504 (yes, PLTPPUI0);
  reading physical block number (PBK#3) at entry 3 (i.e., binary '11') at 516;
  determining data transfer request type at 518 (write);
  determining whether page buffer contents have been modified at 532 (yes);
  determining whether page and block number current at 534 (no, different block);
  writing the page buffer contents to the corresponding page (third page of PBK#2) at 550, which includes determining a new block is required at 552; writing sector data to the third page of PBK#2 at 554 (no); updating at the corresponding page usage flag (P2) in ACPUM at 556 and resetting sector update flags at 558;
  setting the ACPUMF (i.e., 1 for 'modified') at 536; and writing received data sector (S2) into the page buffer and marking corresponding sector ($3^{rd}$) update flag at 538 before going back to "IDLE".

Figure 6D:
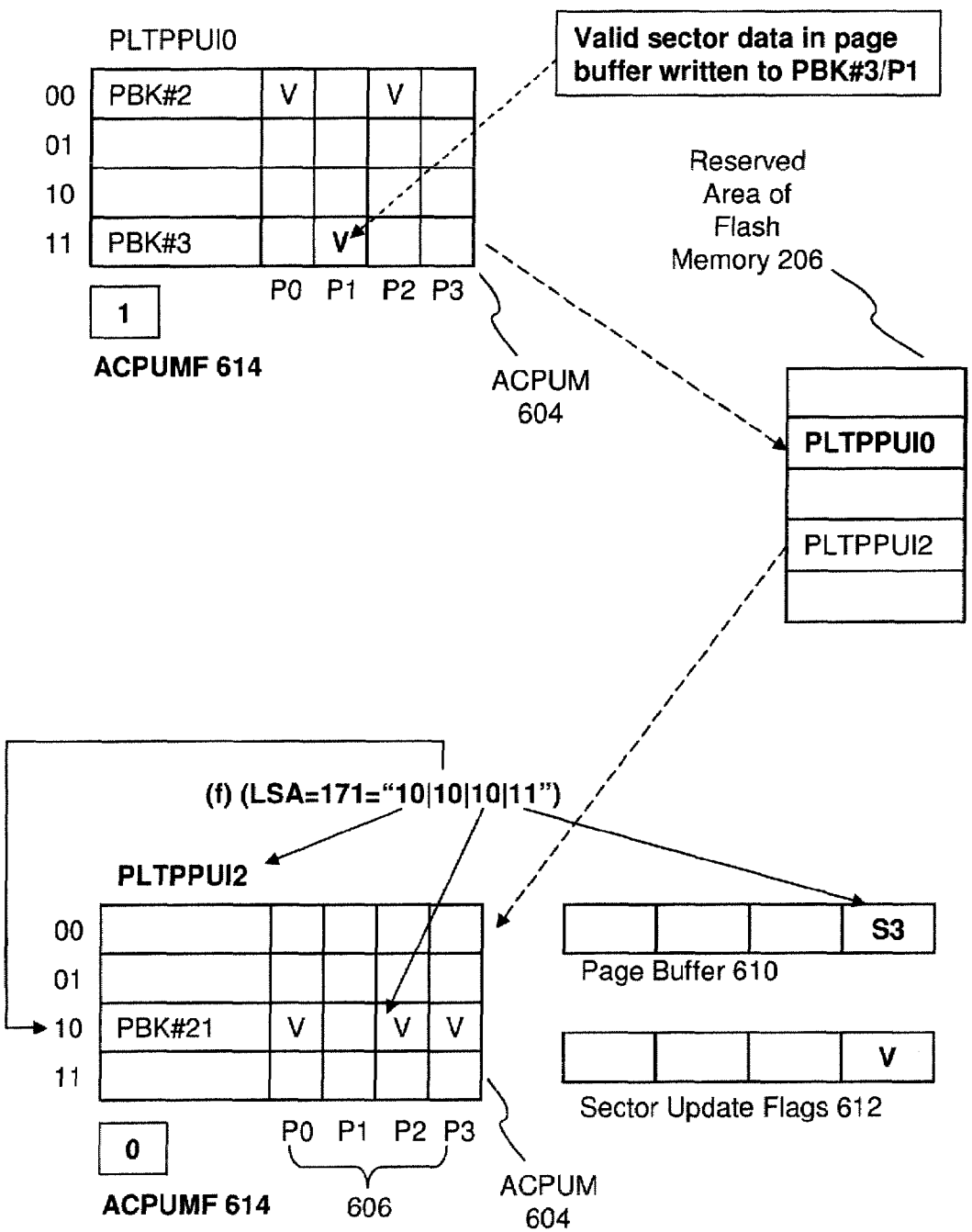

Finally, the next data write request (f) is to write to LSA=171 (FIG. 6D). The corresponding path is the process 500 is as follows:

- receiving an LSA=171 and extracting set, entry, page and set numbers at 502;
- determining whether ACPUM contains a current set of PLTPPUI at 504 (no, PLTPPUI0 does not match PLTP-PUI2);
- determining whether the page buffer contents need to be stored at 506 (yes);
- writing the page buffer contents to the corresponding page (second page of PBK#3) at 550, which includes determining a new block is required at 552; writing sector data to the second page of PBK#3 at 554; updating at the corresponding page usage flag (P1) in ACPUM at 556 and resetting sector update flags at 558 and setting the ACPUMF (i.e., 1 for 'modified') at 508; (shown in upper half of FIG. 6D)
- determining whether ACPUM has been modified at 510 (yes);
- writing the ACPUM contents to corresponding physical block corresponding to the first special logical address for particular one of the N sets of PLTPPUI (PLTP-PUI0), which includes locating the physical block from the PLTPPUI tracking table at 582; determining if the physical block is full at 584 (no); writing the ACPUM contents to a next page in the physical block at 586; updating the PTLPPUI tracking table with the next page number as the highest page number at 588; and resetting the ACPUMF at 590 (i.e., 0 for 'un-modified');
- loading a corresponding set of PLTPPUI (PLTPPUI2) from MLC to ACPUM at 514;
- reading physical block number (PBK#21) at entry 2 (i.e., binary '10') at 516;
- determining data transfer request type at 518 (write);
- determining whether page buffer contents have been modified at 532 (no);
- writing received data sector into the page buffer ad marks the corresponding one of the sector update flags at 538 before going back to the 'IDLE' state;
- determining whether the 'IDLE' time has exceeded a predefined period at 540 (yes); and
- performing background recycling of old blocks with stale data and writing the modified page buffer and ACPUM to MLC at 542 (more details in FIG. 6E).

Figure 6E:
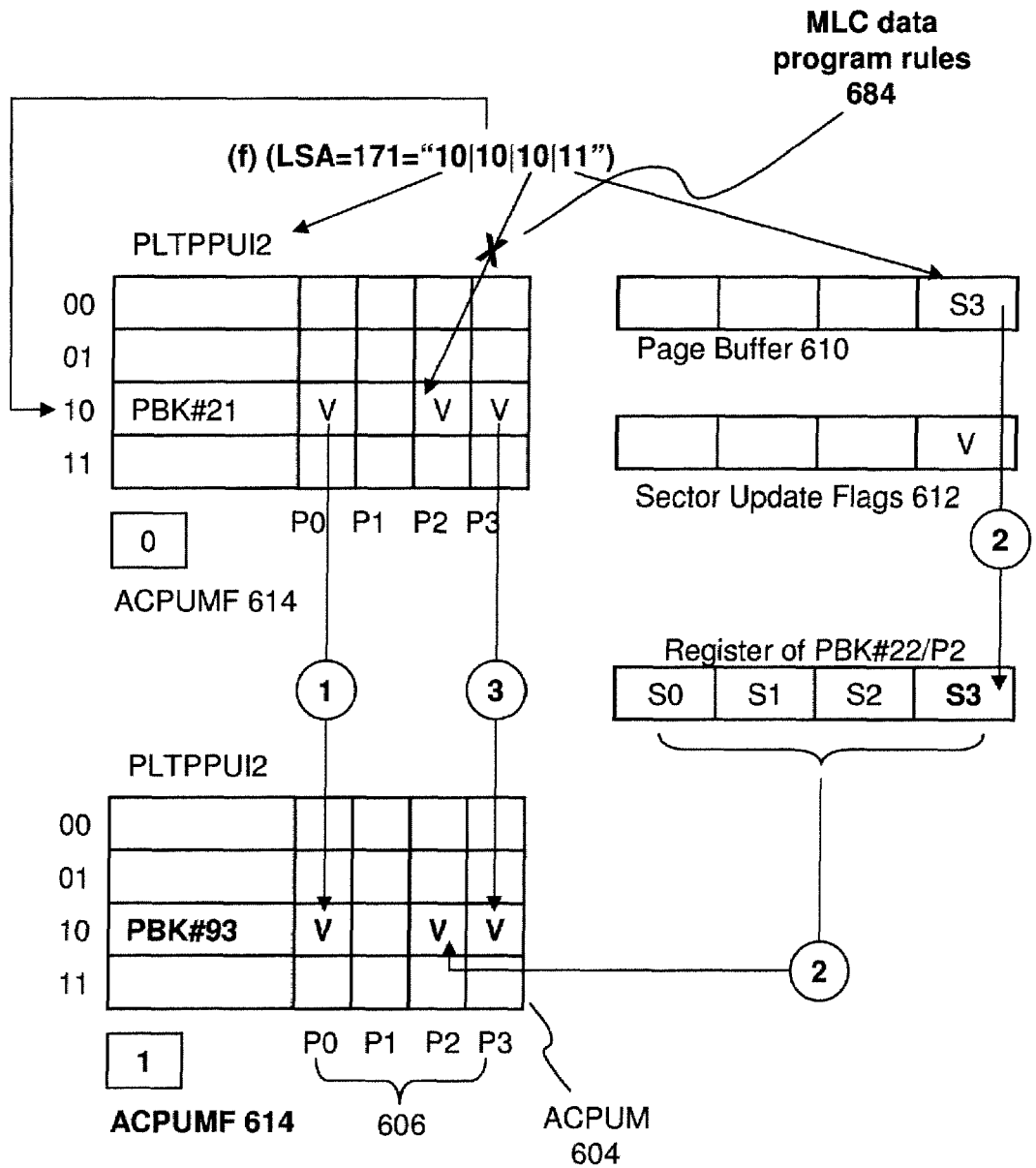

FIG. 6E is a diagram showing a complicated data program or write involving a physical block containing data that prevents another data program operation directly in accordance with the MLC data programming rules. Using the sequence of data write requests shown in FIGS. 6A-6D, after the final data write request (f) has been completed. Both the page buffer 610 and ACPUM 604 have been modified, but yet to be stored in the flash memory. Due to data already existed in certain pages of the physical block (i.e. PBK#21), the MLC data program rules 684 prevent the modified page buffer 610 be written to PBK#21. A new blank block (i.e., PBK#93) is allocated and assigned to hold the data in the old block (PBK#21) including updates from the modified page buffer 610. The corresponding path in the step 550 of the process 500 is as follows:

- determining a new physical block is required according to the MLC rules at 552 (yes);
- allocating and assigning a new block based on the wear leveling rule at 554;
- updating the ACPUM 604 with the new block number (PBK#93) and same page usage flags at 564;
- if required, copying the valid pages with page number smaller than the current page number (i.e., P2 or $3^{rd}$ page derived from LSA) from the old block (PBK#21) to the new block PBK#93) at 566 (see STEP 1 in circle in FIG. 6E);
- writing sector data (S3) from the page buffer to the register of the corresponding page of PBK#93 and thus updating the page in PBK#93 at 568 (see STEP 2 in circle in FIG. 6E);
- if required, copying the valid pages with page number greater than the current page number (i.e., P2 or $3^{rd}$ page derived from LSA) from the old block (PBK#21) to the new block PBK#93) at 570 (see STEP 3 in circle in FIG. 6E); and
- resetting the sector update flags at 558 before following the remaining data write steps of the process 500.

Referring now to FIGS. 7A-7E, which collectively are a flowchart illustrating an exemplary process 700 of initialization of a large capacity flash memory device in accordance with one embodiment of the present invention. The process 700 starts with a power up, for example, a flash memory device is plugged into a host 109. Next, the process 700 recreates the PLTPPUI tracking table 308 of FIG. 3 from stored N sets of PLTPPUI in the reserved area of the flash memory at 710. Then the process 700 validates the stored wear leveling and error correction code information with actual state of all of the physical blocks at steps 730 and 750, respectively. At 770, the process 700 verifies and validates the store PLTPPUI records against actual state of the physical blocks associated with a plurality of first special logical addresses. Finally, the process loads one of the N sets of PLTPPUI into ACPUM 306 at 790 before the initialization ends. The details of steps 710, 730, 750 and 770 are shown and described in respective FIGS. 7B, 7C, 7D and 7E.

Figure 7A:
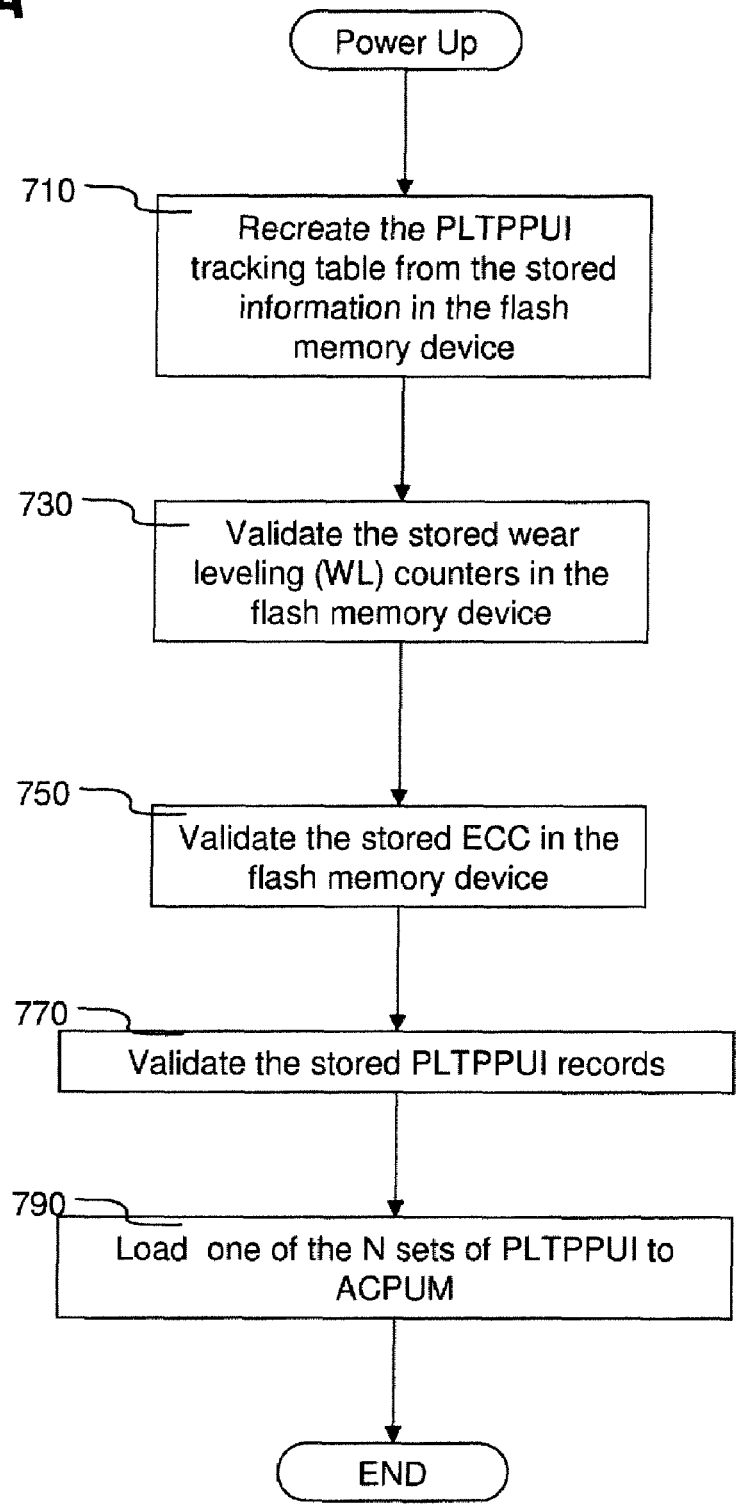
Figure 7B:
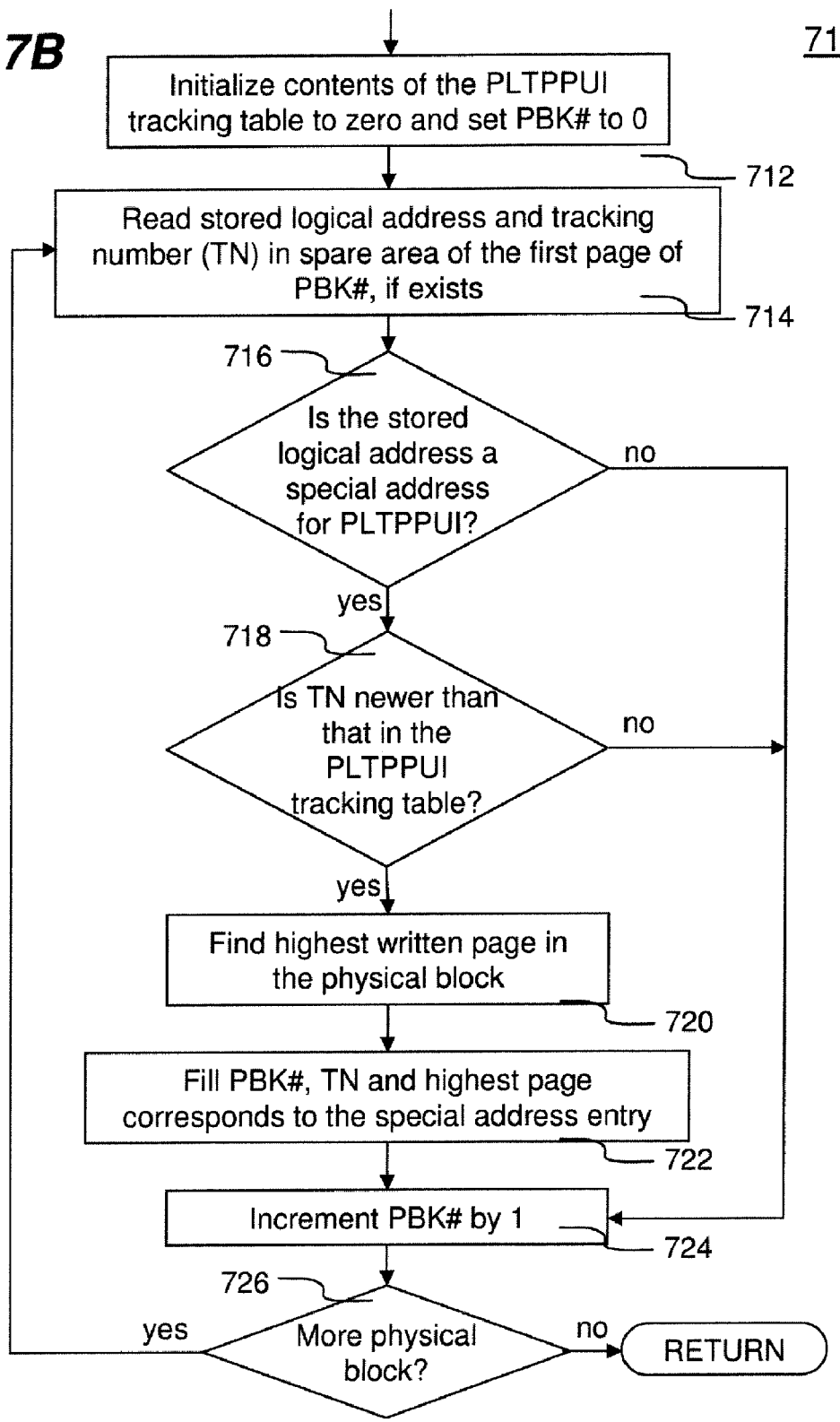

Shown in FIG. 7B, the process 700 initializes contents of the PLTPPUI tracking table 308 to zero and a physical block counter (PBK#) to 0 at 712. Next, the process 700 reads stored logical address and tracking number (TN) in the spare area of the first page of the physical block 'PBK#' at 714. Then the process 700 moves to decision 716, in which it is determined whether the stored logical address is one of the first special addresses for storing PLTPPUI issued by the FW and microcontroller. If 'no', the process 700 simply skips this physical block by incrementing the physical block counter 'PBK#' by one at 724. Next if additional physical block determined at decision 726, the process 700 moves back to step 714 for processing the next physical block, otherwise the step 710 is done.

If 'yes' at the decision 716, the process 700 follows the 'yes' branch to another decision 718. It is then determined whether the stored tracking number is newer than the one listed in the PLTPPUI tracking table 308. For example, the contents in the PLTPPUI tracking table is initialized to zero, any stored tracking number (TN) greater than zero indicates that the stored records are newer. If 'no' at decision 718, the process 700 skips this physical block similar to the 'no' branch of decision 716. However, if 'yes' at decision 718, the process 700 searches and locates a highest written page in this physical block 'PBK#' at 720. Next, at 722, the process 700 writes the 'PBK#', TN and highest page number in the PLTPPUI tracking table corresponding to the first special logical address. Finally, the process 700 increments the physical block count 'PBK#' by one at 724, then moves to decision 726 to determine either moving back to 714 for processing another physical block or ending the step 710.

Details of step 730 are shown in FIG. 7C. At 732, the process 700 initializes a physical block counter 'PBK#' and a group counter 'm' to zero. Next, the process 700 loads a 'm$^{th}$' group of stored WL/BB tracking table into a scratch memory space (e.g., the page buffer 314 of FIG. 3) at 734. Then the process 700 reads the wear leveling (WL) counter and bad block indicator for the physical block 'PBK#' at 736. The process 700 moves to decision 738, in which it is determined whether the stored information is in conflict with the physical state of 'PBK#'. If 'yes', the process 700 corrects the conflict information to be consistent with the physical state in the scratch memory at 740. If 'no' at decision 738, there is no need to correct the conflict.

Next, at 742, the physical block counter 'PBK#' is incremented by one. The process 700 moves to another decision 744, it is determined if there is additional block in the 'm$^{th}$' group. If 'yes', the process 700 goes back to step 736 reading another WL counters of another physical block to repeat the above steps until the decision 744 becomes 'no'. The process 700 updates the stored WL/BB tracking table 310 at 746. At next decision 748, it is determined if there is any more physical block. If 'yes', the process 700 increments the group counter at 749 then goes back to 734 for repeating the above steps for another group. Otherwise, the step 730 returns when the decision 748 is 'no'.

FIG. 7D shows details of step 750, which is substantially similar to the step 730. Instead of checking and correcting conflict WL/BB information, the step 750 validates and corrects the stored error correction code (ECC) for all physical blocks. The number of group is related to the size of the scratch memory. For example, a 2048-byte page buffer can provide space for holding a group of 1024 WL counters, if each of the WL counters is a 16-bit number. As to the 8-bit ECC, the same 2048-byte page buffer may hold a group of 2048 ECC codes.

Figure 7E:
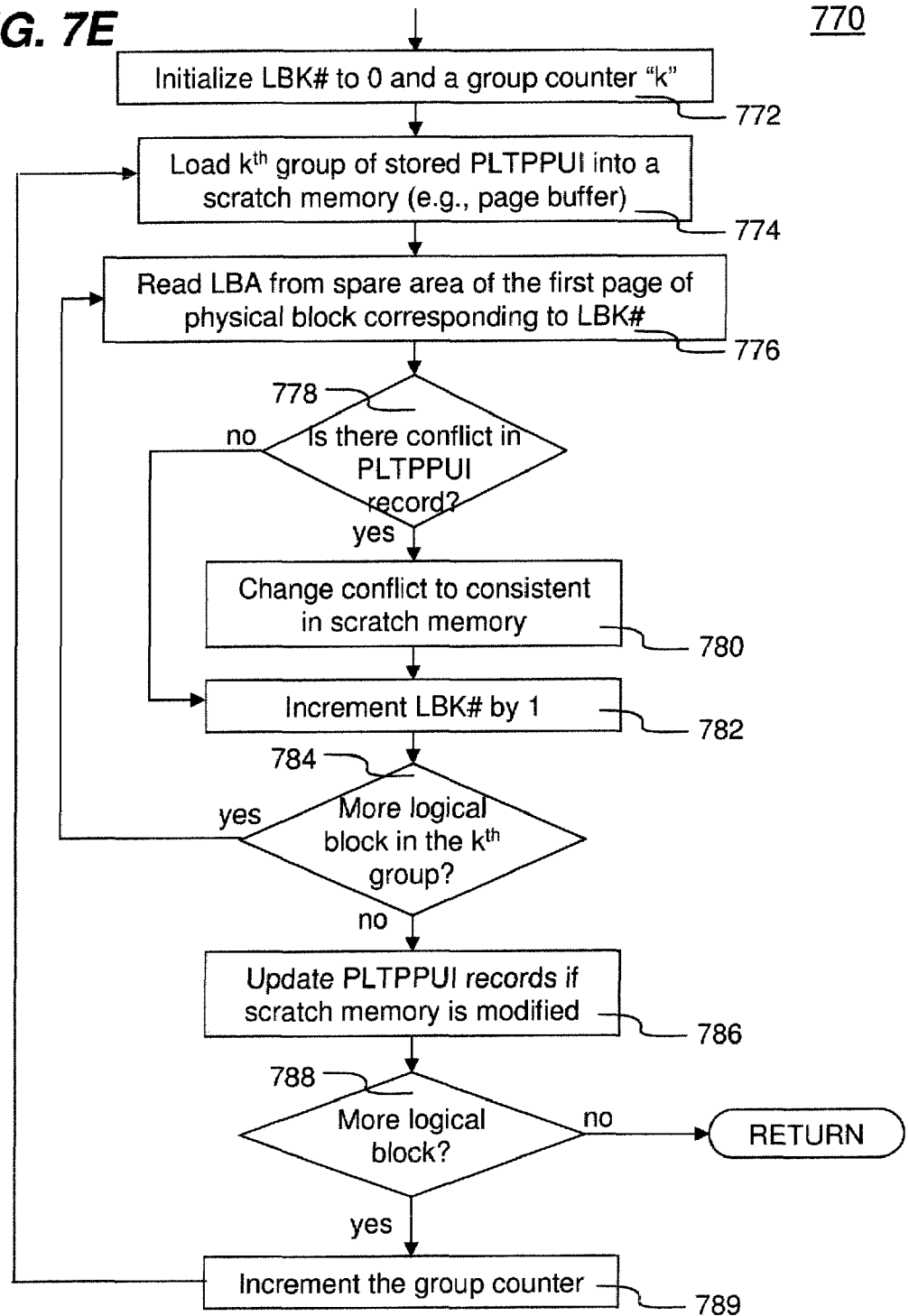

FIG. 7E shows details of step 770. At 772, the process 700 initializes a logical block counter 'LBK#' and a group counter 'k' to zero. The process 700 loads a 'k$^{th}$' group of stored PLTPPUI into a scratch memory space (e.g., a page buffer or other available memory) at 774. The process 700 reads logical block address from the spare area of the first page of a physical block corresponding to the 'LBK#' at 776. Next, at decision 778, it is determined whether there is conflict between the stored PLTPPUI and the physical page usage of the physical block. If 'yes', the conflict is corrected with the physical state in the scratch memory at 780. Otherwise, the process 700 skips step 780. Next, at 782, the process 700 increments the logical block counter 'LBK#' by one. The process 700 then moves to another decision 784, in which it is determined if there is more block in the 'k$^{th}$' group. If 'yes', the process 700 moves back the step 776 repeating the process until the decision 784 becomes 'no'. Then the process 700 updates the stored PLTPPUI records if the scratch memory has been altered at 786. Next, at decision 788, if there is more logical block, the process 700 follows the 'yes' branch to step 789 by incrementing the group counter and repeating the process from step 774 until the decision 788 becomes 'no', in which the step 770 ends.

Each entry record of PLTPPUI is 18-byte, which is a sum of 2-byte physical block number plus 128-bit (i.e., 16-byte) of page usage flags (i.e., 128 pages per block). Using 2048-byte page buffer as a scratch memory can only hold a group of 113 entry records. One may use a larger memory such as ACPUM 306 as the scratch memory, which may hold more entry records thereby reducing the initialization time.

Figure 8A:
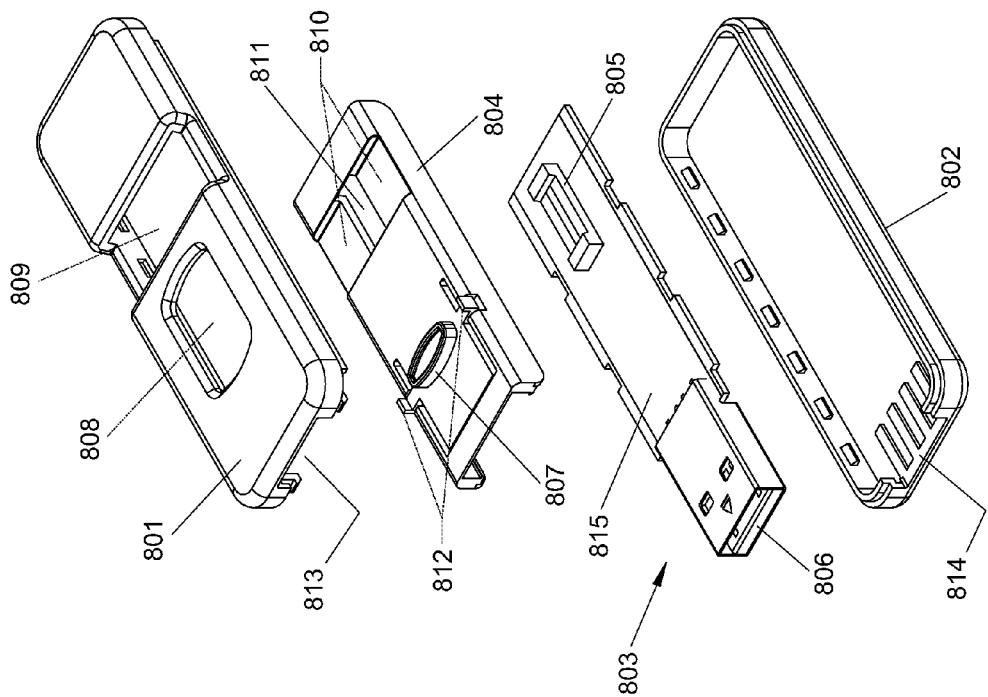
FIGS. 8A-8I are various perspective views and exploded perspective views of exemplary flash memory devices in accordance with several embodiments of the present invention.
Figure 8A:
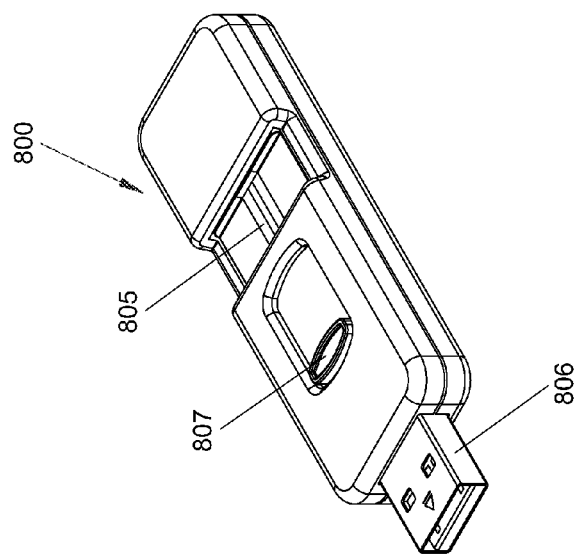

Referring now to FIG. 8A, which shows perspective and exploded perspective views of an exemplary flash memory device with a fingerprint sensor in accordance with one embodiment of the present invention. The perspective view shows the flash memory device 800 with a fingerprint sensor that corresponds to the first flash memory device 100 of FIG. 1A or the second flash memory device 120 of FIG. 1B. The perspective view also shows a slide button exposed from a top housing 801 for sliding the USB plug connector 806 external to the housing via openings 813 and 814. The exploded perspective view shows the flash memory device 800 comprises a top housing 801, bottom housing 802, a flash memory core unit 803, and a core unit carrier 804. The top housing and bottom housing may be attached to each other via variety of method, including using a snap together mechanism (FIG. 8H) or ultrasonic welding (FIG. 8I) around edges of top and bottom housing. The core unit 803 includes an interface connector 806 (i.e., Universal Serial Bus (USB) plug connector) disposed on a printed circuit board (PCB) 815 having an MLC flash controller (not shown) and one or more MLC flash memory devices (not shown) mounted thereon. The USB connector 806 is coupled to the PCB electrically and physically such that control signals and power can pass through. The core unit 803 further includes a fingerprint sensor 805 which may also be implemented using the techniques described above. The core unit 803 is attached to a core unit carrier 804 which includes a slide button 807 for a user to slide the USB plug connector 806 external to the housing via slide button opening 808, the lock tabs 812 to lock the USB plug connector 806 at deployed or retracted positions, and an indent space 810 configured for fingerprint sensing area (i.e., space for user's finger) with a cut-out 811 for exposing the fingerprint sensor to a user's finger. Both the core unit and the carrier are enclosed inside the top and bottom housing 801 and 802.

Note that fingerprint sensor is disposed on the PCB 815 in a longitudinal direction such that when a user to use a thumb to slide the USB plug connector 806 to a deployed position, the thumb would be slide across the fingerprint sensor 805 to enable the fingerprint sensor to scan the thumb of the user while the USB plug connector being deployed. Further, the slide button 807 is disposed on the top surface of the core unit carrier which may be made of elastic material such as plastic. The top surface of the core unit carrier includes a front section, a rear section, and a center section in between. The front and rear sections are fixedly coupled to the frontend and backend of the core unit carrier, while the center section is separated from the side surfaces with an open space. When the finger of the user press downwardly on the slide button 807, the center section will resiliently move down and the lock tabs will be disengaged from the corresponding lock grooves for deployed and retracted positions (not shown) disposed on an inner wall of the top housing 801 and the core unit 803 is then pushed out from the opening formed by cutouts 813-814. The lock tabs then reengage with the corresponding lock grooves of the top housing 801 in a deployed position when the slide button is released to allow the center section to resiliently recover to its natural position. Similarly, from the deployed position, when the finger of the user presses downwardly on the slide button 807, the lock tabs then are disengaged from the top housing again and the core unit 803 may then be retracted from the deployed position to a retracted position.

Further, a special design for industrial and military application on the finished assembly of the flash memory device includes a conforming coating to achieve the purposes of preventing oxidation of integrated circuit leads or soldering area; covering or protecting extreme temperature exposure either cold or hot; and waterproofing for certain military or industrial applications. The procedure of applying the conforming coating to the flash memory device includes: 1) putting a masking cap or tape on specific area such as connectors, switches; 2) spraying or brushing the conforming coating material (e.g., HumiSeal® 1B73); and 3) inspecting the coated area with ultraviolet (UV) lights for imperfection (e.g., bubbles, missed coating area).

PCB is a medium means used for mechanically support and electrically connection of electronic components using conductive pathways, or traces, etched from copper sheets laminated onto a non-conductive substrate. The core unit is also referred to as a print circuit board assembly (PCBA).

In addition, the top housing comprises an opening for fingerprint sensing area, an opening for the slide button from the core unit carrier, and the lock grooves (not shown) in matching with the lock tabs from the core unit carrier to lock the USB plug connector at deployed and retracted positions. Each of the top and bottom housing includes a cut out to allow the USB plug connector to be extended external to the housing. In this example, the MLC USB device is implemented in a PCBA package.

The deploying and retracting the USB plug connector out of and into the housing plus the locking mechanism between the locking tabs (core unit carrier) and the locking grooves (housing) are described in details in a co-pending of U.S. patent application Ser. No. 11/845,747, filed Aug. 27, 2007.

Figure 8B:
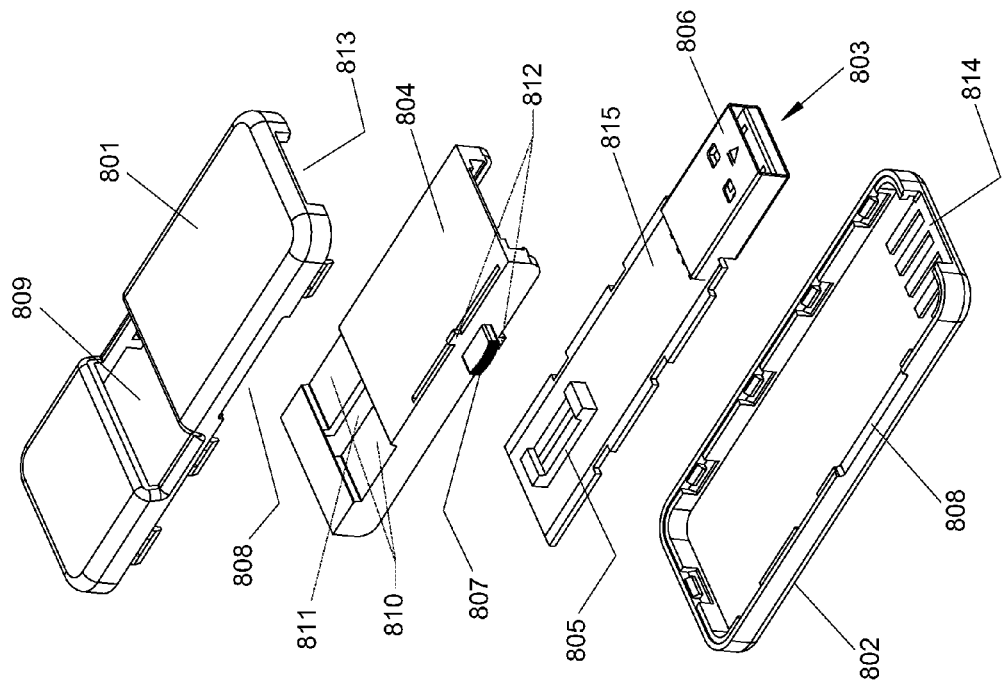
Figure 8B:
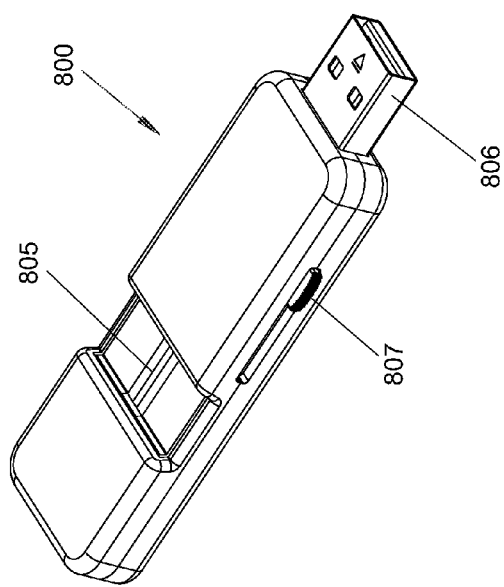

Referring now to FIG. 8B, which also shows perspective and exploded perspective views of a similar flash memory device with a fingerprint sensor as shown in FIG. 8A except the slide button 807 in this embodiment is exposed from the side via opening 808 of the housing for sliding the USB plug connector 806 external to the housing. The exploded perspective view shows the flash memory device comprises a top housing 801, bottom housing 802, a flash memory core unit 803, and a core unit carrier 804, similar to the configuration as shown in FIG. 8A. The features of the top, bottom housing, the core unit, and the carrier are similar as described above except the slide button 807 and the lock tabs 812 are on the side of the core unit carrier 804. Therefore, in the top and bottom housing, the cut-out for the slide button for exposing is on the side, and the top and bottom housing includes the lock grooves (not shown) in matching with the lock tabs from the core unit carrier to lock the USB plug connector at deployed and retracted positions. Similarly, the side surface of core unit carrier includes a front section, a rear section, and a center section in between. The front and rear sections are fixedly coupled to the frontend and backend of the core unit carrier while the center section is separated from the top surface of the core unit carrier to allow the side surface with the slide button to resiliently move inwardly and outwardly, which causes the lock tabs to be engaged and/or disengaged from the corresponding lock grooves of the top housing. For the purposes of illustrating, certain reference numbers for similar components of the device are maintained the same although their positions may be different or similar.

Figure 8C:
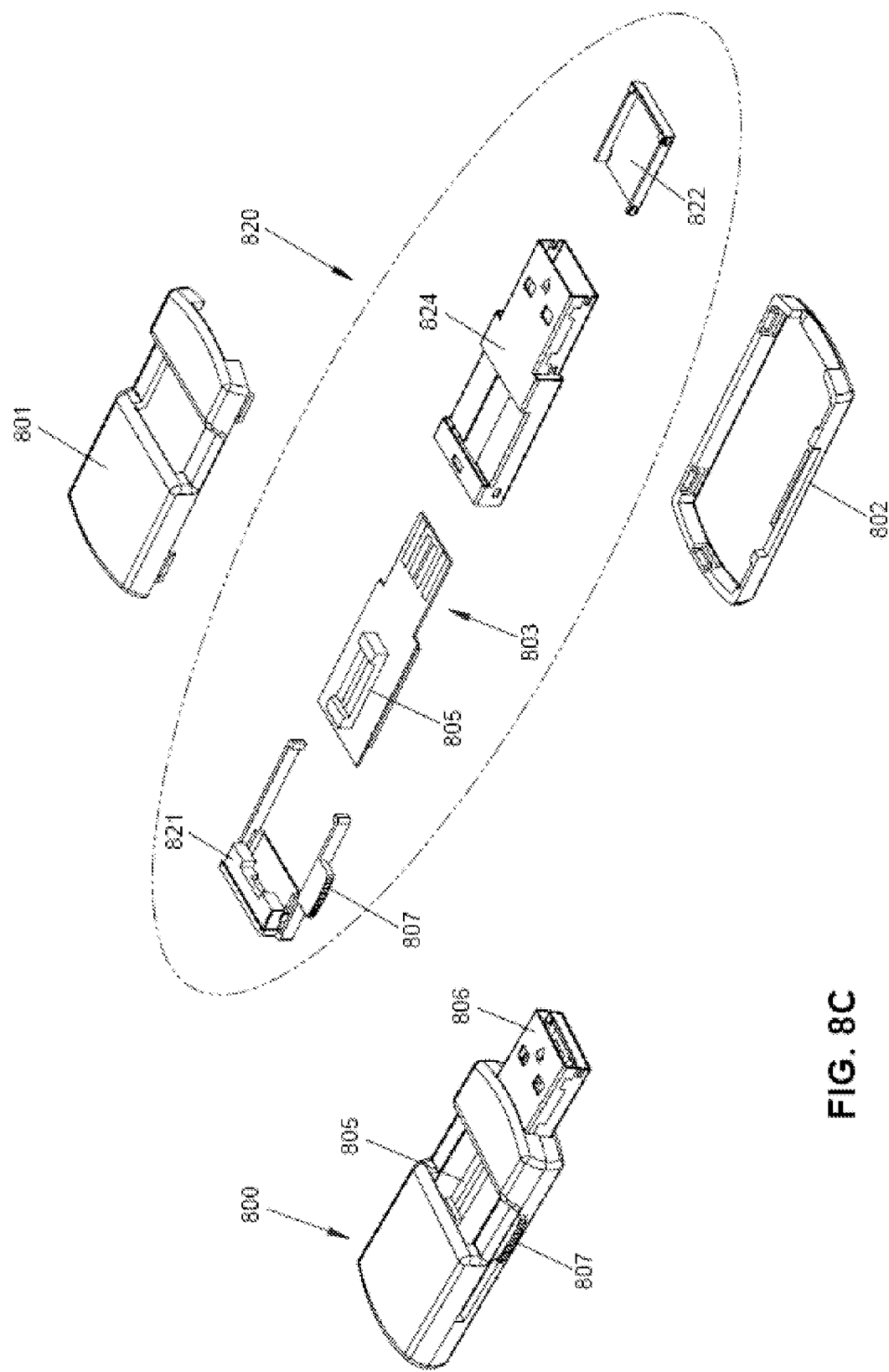

Referring now to FIG. 8C, which shows perspective and exploded perspective views of a slim flash memory device, is implemented in a slim package 820 with fingerprint sensor in accordance with one embodiment of the present invention. The perspective view shows a slide button is exposed from the side of the housing for sliding the USB plug connector external to the housing similar to the configuration as shown in FIG. 8B. The exploded perspective view shows the slim flash memory device comprises a top housing 801, bottom housing 802, and a slim package 820. The slim package 820 includes a housing 824 which may be implemented as a metal case, a PCBA 803 having an MLC controller and MLC memory devices (not shown) with a fingerprint sensor thereon may be inserted into the housing and supported by a support piece 822 and enclosed by an end cap 821. The interface connector is made of a combination of the front portion of the PCBA, the front portion of the metal case and the support piece.

The slide button 807 is implemented as part of end cap 821 and includes a slot to receive a rear end of PCBA 803, where a front end of PCBA 803 is supported by the support piece 822 and enclosed by housing 824 while exposing the fingerprint sensor 805 via an opening as described above. Again, for the purposes of illustrating, certain reference numbers for similar components of the device are maintained the same although their positions may be different or similar.

Figure 8D:
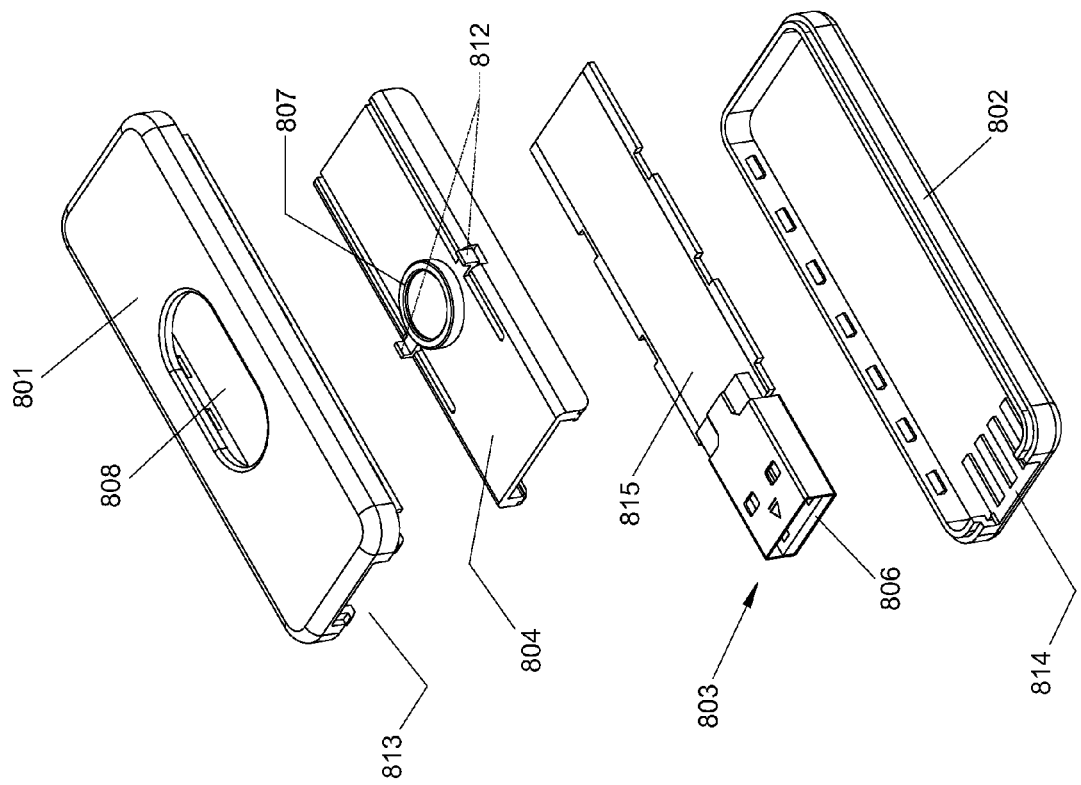
Figure 8D:
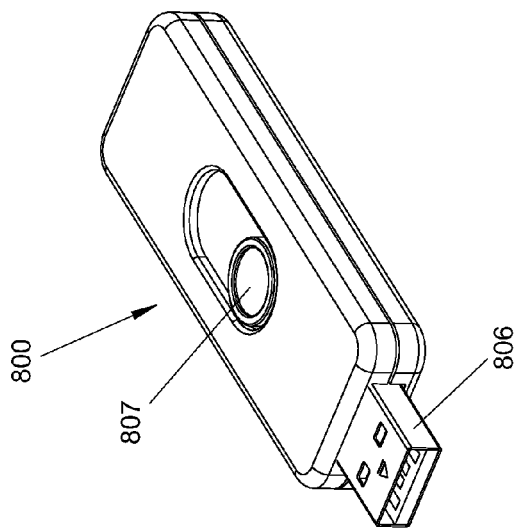

FIG. 8D shows a perspective view and an exploded perspective view of an alternative flash memory device without a fingerprint sensor (e.g., flash memory device 140 of FIG. 1C) is implemented in the PCBA package according to another embodiment of the present invention. The perspective view also shows a slide button is exposed from the top housing for sliding the USB plug connector external to the housing, similar to the one as shown in FIG. 8A, except in this embodiment a fingerprint sensor is optional. The exploded perspective view shows that the flash memory device comprises a top housing, bottom housing, a flash memory core unit, and a core unit carrier. Similar to the configuration shown in FIG. 8A, the core unit 803 comprises an interface connector 806 (i.e., USB plug connector), a PCB with a plurality of chips mounted thereon (e.g., MLC flash controller and MLC flash memory chip (not shown)). The core unit is attached to a core unit carrier 804 which includes a slide button 807 for a user to slide the USB plug connector 806 external to the housing and the lock tabs 812 to lock the USB plug connector 806 at deployed and retracted positions by locking with the lock grooves disposed at an inner wall of the top housing 801 (not shown). The top housing 801 comprises an opening 808 for the slide button 807 from the core unit carrier 804 and the lock grooves (not shown) in matching with the lock tabs 812 from the core unit carrier 804 to lock the USB plug connector at deployed and retracted positions. Each of the top and bottom housing includes a cut out 813-814 to allow the USB plug connector to be extended external to the housing. Again, for the purposes of illustrating, certain reference numbers for similar components of the device are maintained the same although their positions may be different or similar.

Figure 8E:
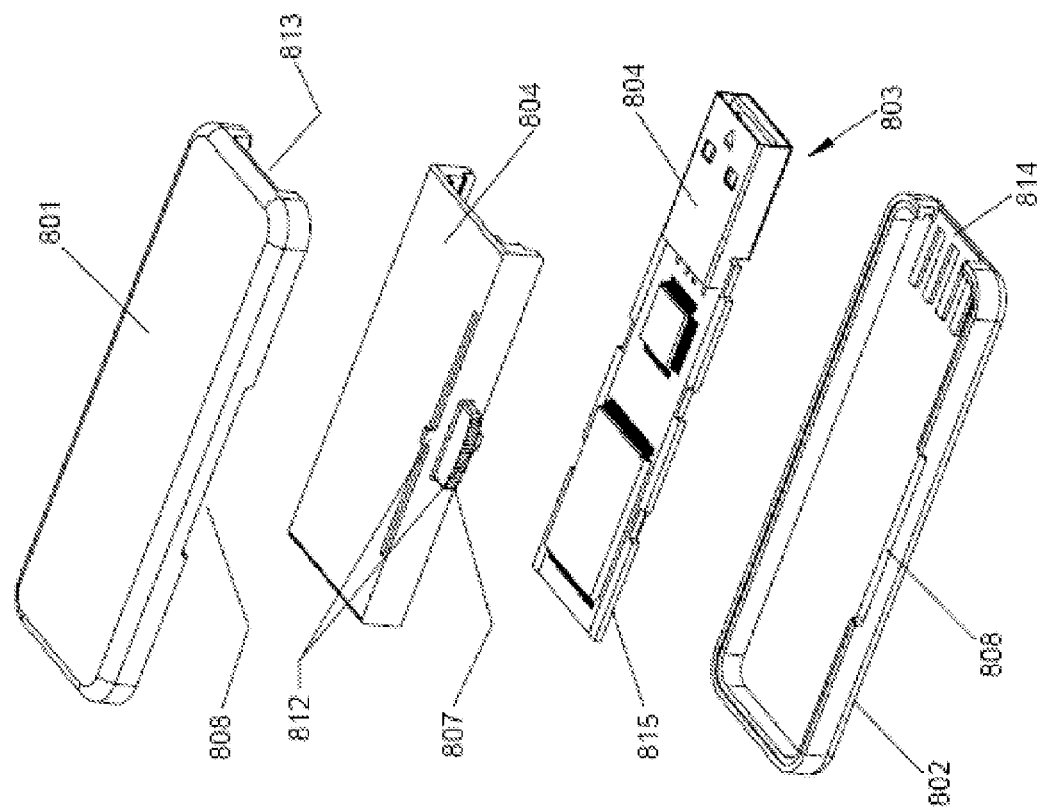
Figure 8E:
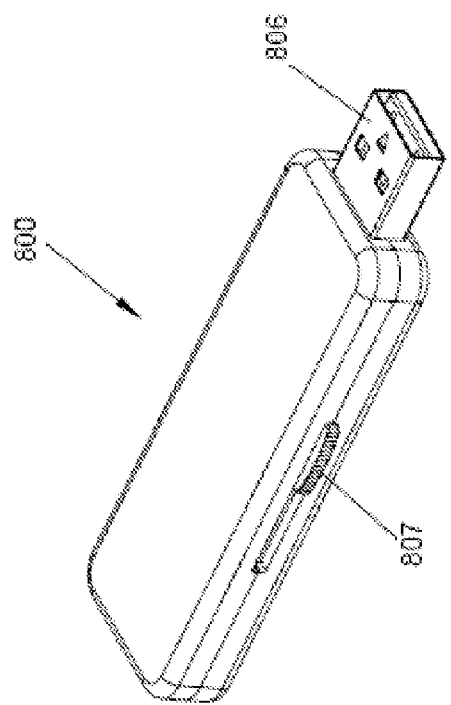

Referring now to FIG. 8E, which also shows perspective and exploded perspective views of a similar flash memory device without a fingerprint sensor as shown in FIG. 8D except the slide button in this present invention is exposed from the side of the housing for sliding the USB plug connector external to the housing. Similar to the configuration as shown in FIG. 8B, the exploded perspective view shows the flash memory device 800 comprises a top housing 801, bottom housing 802, a flash memory core unit 803, and a core unit carrier 804. The features of the top, bottom housing, the core unit, and the carrier are similar as described above except the slide button and the lock tabs are on the side of the core unit carrier. Therefore, in the top and bottom housing, the cut-out for the slide button for exposing is on the side, and the top and bottom housing includes the lock grooves (not shown) in matching with the lock tabs from the core unit carrier to lock the USB plug connector at deployed and retracted positions. Again, for the purposes of illustrating, certain reference numbers for similar components of the device are maintained the same although their positions may be different or similar.

Figure 8F:
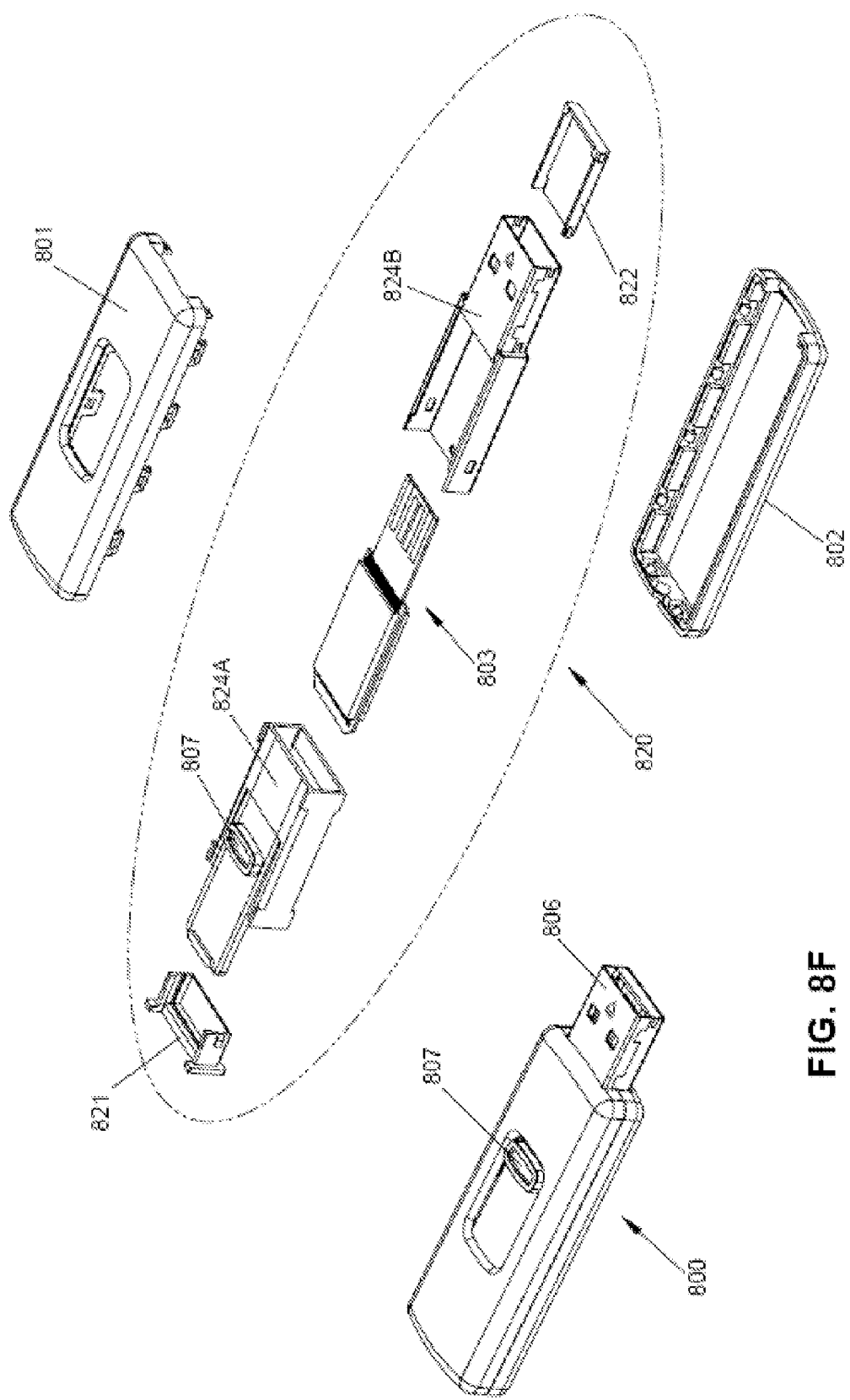

Referring now to FIG. 8F, which shows perspective and exploded perspective views of a slim flash memory device, is implemented in a slim package without fingerprint sensor in accordance with one embodiment of the present invention. The perspective view shows a slide button is exposed from the top housing for sliding the USB plug connector external to the housing, similar to the configuration as shown in FIG. 8C. The exploded perspective view shows the slim flash memory device 800 comprises a top housing 801, bottom housing 802, and a slim package 820. The slim package 820 includes a housing which may be implemented as a metal case 824B and a metal cover 824A, a PCBA 803 having an MLC controller (not shown) and MLC memory devices thereon may be inserted into the housing and supported by a support piece 822 and enclosed by an end cap 821. The interface connector is made of a combination of the front portion of the PCBA, the front portion of the metal case and the support piece. Again, for the purposes of illustrating, certain reference numbers for similar components of the device are maintained the same although their positions may be different or similar.

Figure 8G:
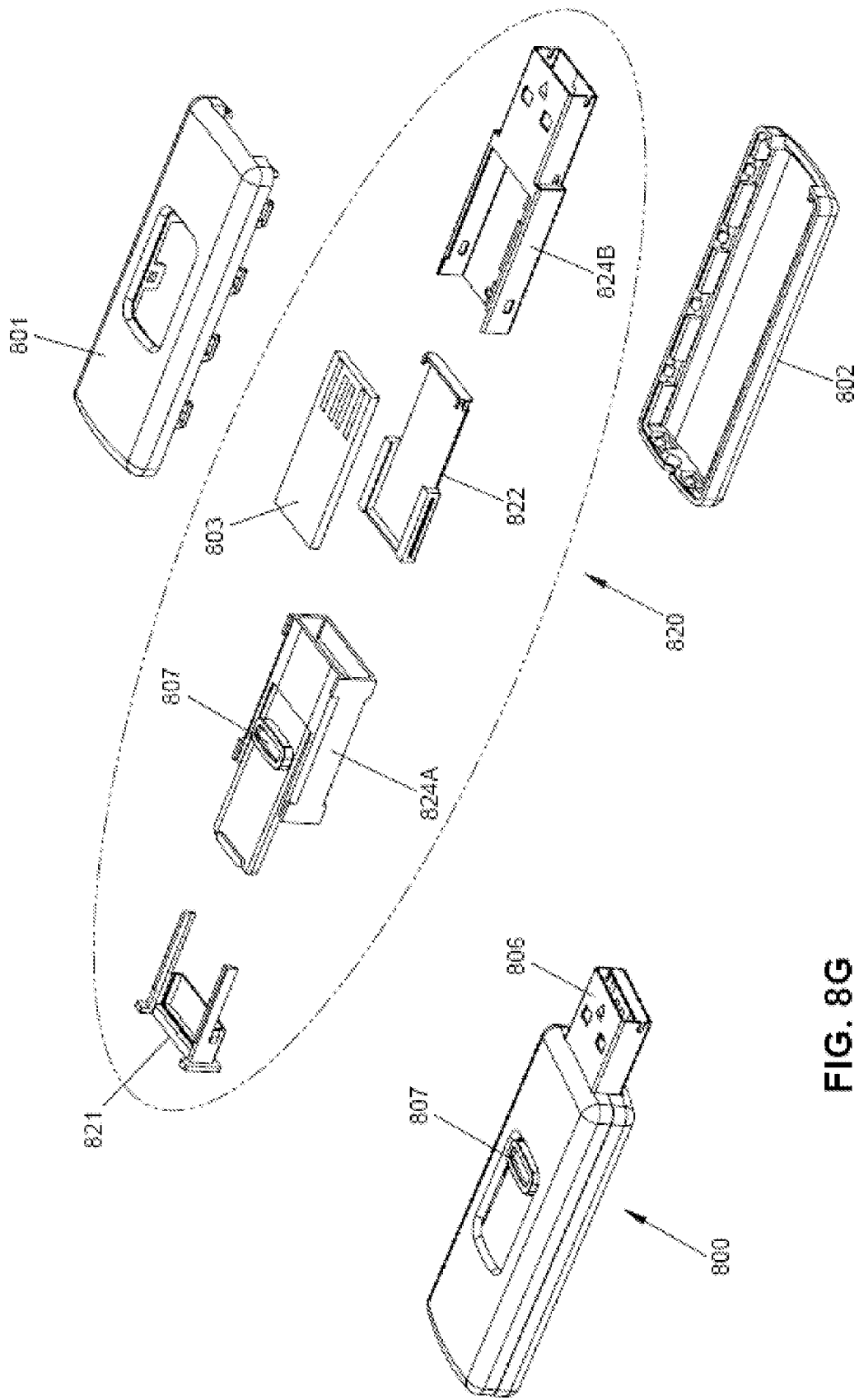

FIG. 8G shows a perspective view and an exploded perspective view of COB flash memory device, is implemented in a COB package without fingerprint sensor in accordance with one embodiment of the present invention. Similar to the configuration as shown in FIG. 8F, referring to FIG. 8G, the perspective view shows a slide button is exposed from the top housing for sliding the USB plug connector external to the housing. The exploded perspective view shows the COB flash memory device 800 comprises a top housing 801, bottom housing 802, and a COB package 820. The COB package 820 includes a housing which may be implemented as a metal case 824B and a metal cover 824A, a Chip-on-Board (COB) 803 is manufactured using the technology in which a substrate with all components (i.e., flash memory chip, controller and passive components) mounted thereon may be inserted into the housing 801-802 and supported by a support piece 822 and enclosed by an end cap 821. The interface connector 806 is made of a combination of the front portion of the COB, the front portion of the metal case and the support piece. Again, for the purposes of illustrating, certain reference numbers for similar components of the device are maintained the same although their positions may be different or similar.

Figure 8H:
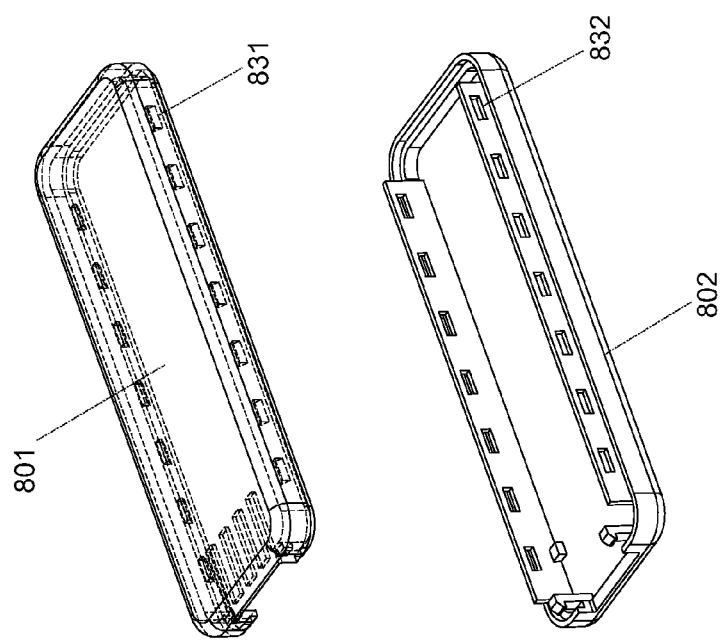

As shown in FIG. 8H, a MLC based flash memory device (not shown) may be protected by the top and bottom housing 801-802 joined using snap-together mechanism. Tabs 831 of the top housing 801 snap into corresponding slots 832 of the bottom housing 802 in snap-together mechanism of joining the top and bottom housing.

Figure 8I:
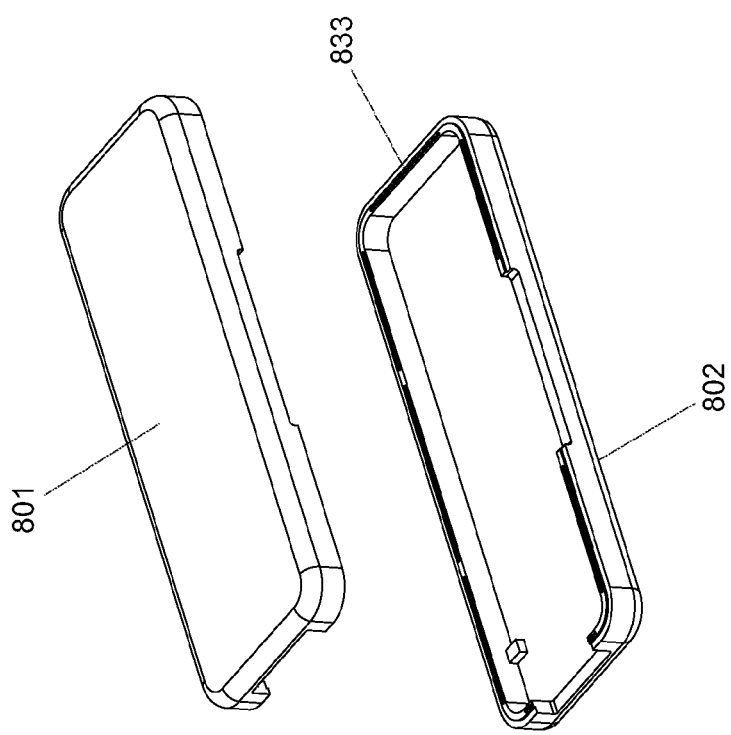

Alternative means for joining top and bottom housings shown in FIG. 8I. The top and bottom housing 801-802 are joined by ultrasonic welding. The materials of the top and bottom housing to use in this process may be made of thermoplastic materials such as Acrylonitrile Butadiene Styrene (ABS), ABS/polycarbonate alloy, polyester, Polyvinyl chloride (PVC), Nylon and Nylon with fiberglass. Multiple ultrasonic bonders 833 is applied on the flat edges of the side walls of the bottom housing to serve as the initial melting point as an ultrasonic wave from welding machine generates high frequency vibration between the ultrasonic bonder and the top housing.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the present invention also relate to an apparatus for performing the operations herein. This apparatus may be specially constructed for the required purposes, or it may comprise a general-purpose computer selectively activated or reconfigured by a computer program stored in the computer. Such a computer program may be stored in a computer readable medium. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., carrier waves, infrared signals, digital signals, etc.)), etc.

The algorithms and displays presented herein are not inherently related to any particular computer or other apparatus. Various general-purpose systems may be used with programs in accordance with the teachings herein, or it may prove convenient to construct more specialized apparatus to perform the required method operations. The required structure for a variety of these systems will appear from the description below. In addition, embodiments of the present invention are not described with reference to any particular programming language. It will be appreciated that a variety of programming languages may be used to implement the teachings of embodiments of the invention as described herein.

Although the present invention has been described with reference to specific embodiments thereof, these embodiments are merely illustrative, and not restrictive of, the present invention. Various modifications or changes to the specifically disclosed exemplary embodiments will be suggested to persons skilled in the art. For example, whereas the size of the data area of a page has been shown to hold four sectors of 512-data, a page holds other number of sectors such as eight may be used. In summary, the scope of the invention should not be restricted to the specific exemplary embodiments disclosed herein, and all modifications that are readily suggested to those of ordinary skill in the art should be included within the spirit and purview of this application and scope of the appended claims.

What is claimed is:

1. A portable universal serial bus (USB) storage device, comprising:
   a core unit having a USB plug connector coupled to one or more multi-level cell (MLC) flash memory devices and an MLC flash controller disposed therein, the MLC flash controller controlling the one or more MLC flash memory devices and the USB plug connector providing an interface for accessing the one or more MLC flash memory devices;
   a housing having a top housing and a bottom housing for enclosing the core unit, wherein the top housing and the bottom housing when attached together form a front end opening to allow the USB plug connector to be deployed external to the housing; and
   a core unit carrier for carrying the core unit to slide the USB plug connector in and out via the front end opening of the housing for deploying and retracting the core unit, wherein the core unit carrier includes a slide button disposed on a top surface of the core unit carrier,
   wherein the top housing further includes a slide button opening, which when the top housing and the bottom housing enclose the core unit carrier carrying the core unit, causes the slide button of the core unit carrier to be exposed external to the top housing via the slide button opening, wherein the exposed button allows a finger of a user to slide the USB plug connector of the core unit in and out of the housing via the front end opening of the housing, wherein when the slide button slides forwardly towards a front end of the housing, the USB plug connector of the core unit is in a deployed position, and wherein when the slide button slides backwardly towards a backend of the housing, the USB plug connector of the core unit is in retracted position by retracting the USB plug connector into the housing.

2. The portable USB device of claim 1, wherein the core unit carrier further comprises one or more lock tabs disposed on the top surface of the core unit carrier, wherein the top housing further comprises a first set of lock grooves and a second set of lock grooves disposed on an inner wall of the top housing, and wherein when the core unit is in the deployed position, the lock tabs of the core unit carrier are interlocked with the first set of lock grooves and when the core unit is in the retracted position, the lock tabs of the core unit carrier are interlocked with the second set of lock grooves.

3. The portable USB device of claim 2, wherein the core unit carrier further comprises a first side surface and a second side surface bended downwardly to form a U-shape channel, wherein edges of the first and second side surfaces are bended inwardly to form a U-shape tray to allow the core unit to slide into the core unit carrier in order for the core unit carrier to carry the core unit.

4. The portable USB device of claim 3, wherein the top surface of the core unit carrier is made of elastic material having a front section, a rear section, and a center section coupled in between, wherein the front section and the rear section of the top surfaces are fixedly coupled to the first and second side surfaces at a frontend and a backend of the core unit carrier respectively while the center section is separately with an opening space from the first and second side surfaces respectively to allow the center section to resiliently move up and down while the front and rear sections are fixed with the frontend and backend of the core unit carrier.

5. The portable USB device of claim 4, wherein when the slide button is pressed downwardly, the center section of the top surface is resiliently pushed down which causes the lock tabs to be disengaged from the corresponding lock grooves of the top housing, and wherein when the slide button is released from pressing, the center section of the top surface resiliently recovers to a natural position which causes the lock tabs to be engaged with the corresponding lock grooves of the top housing to lock the core unit in either a deployed position or a retracted position.

6. The portable USB device of claim 5, wherein the lock tabs comprise a first lock tab disposed on a first edge of the center section and a second lock tab disposed on a second edge of the center section, wherein the first and second side surfaces comprise a first and second retaining slots respectively to retain the first and second lock tabs respectively, and wherein the first and second retaining slots are to limit amount of space downwardly that the center section can be pressed.

7. The portable USB device of claim 6, wherein the core unit carrier further comprises a fingerprint cutout and the core unit further comprises a fingerprint sensor disposed on a top surface of the core unit and exposed via the fingerprint cutout when the core unit slides into the core unit carrier, and wherein the fingerprint sensor is to scan a finger of the user to obtain an identity of the user to determine whether the user is eligible to access content stored in the MLC flash memory devices.

8. The portable USB device of claim 7, wherein the top housing further comprises a fingerprint sensing opening area to expose the fingerprint sensor when the core unit is deployed and the fingerprint sensor is covered by the top housing when the core unit is in the retracted position.

9. The portable USB device of claim 8, wherein the fingerprint sensor is disposed in a longitudinal direction with respect to the core unit to allow the fingerprint sensor to scan the finger of the user when the finger slide back and forth on the fingerprint sensor.

10. The portable USB device of claim 1, wherein the core unit is implemented in one of a regular PCB (printed circuit board) package, a slim flash memory package and a COB (chip on bard) package, and wherein the top housing and the bottom housing are attached to each other via a snap together mechanism or an ultrasonic welding technique.

11. A portable universal serial bus (USB) storage device, comprising:
   a core unit having a USB plug connector coupled to one or more multi-level cell (MLC) flash memory devices and an MLC flash controller disposed therein, the MLC flash controller controlling the one or more MLC flash memory devices and the USB plug connector providing an interface for accessing the one or more MLC flash memory devices;
   a housing having a top housing and a bottom housing for enclosing the core unit, wherein the top housing and the bottom housing when attached together form a frontend opening to allow the USB plug connector to be deployed external to the housing; and
   a core unit carrier for carrying the core unit to slide the USB plug connector in and out via the frontend opening of the housing for deploying and retracting the core unit, wherein the core unit carrier includes a slide button disposed on a side surface of the core unit carrier,
   wherein the top housing further includes a first cutout on a side surface of the top housing and the bottom housing further includes a second cutout on a side surface of the bottom housing, which when the top housing and the bottom housing enclose the core unit carrier carrying the core unit, the first and second cutouts form a slide button opening on a side surface of the enclosed housing,
   wherein the slide button of the core unit carrier is exposed external to the housing via the slide button opening formed on a side of the housing, wherein the exposed button allows a finger of a user to slide the USB plug connector of the core unit in and out of the housing via the front end opening of the housing, wherein when the slide button slides forwardly towards a front end of the housing, the USB plug connector of the core unit is in a deployed position, and wherein when the slide button slides backwardly towards a backend of the housing, the USB plug connector of the core unit is in retracted position by retracting the USB plug connector into the housing.

12. The portable USB device of claim 11, wherein the core unit carrier further comprises one or more lock tabs disposed on the top surface of the core unit carrier, wherein the top housing further comprises a first set of lock grooves and a second set of lock grooves disposed on an inner wall of the top housing, and wherein when the core unit is in the deployed position, the lock tabs of the core unit carrier are interlocked with the first set of lock grooves and when the core unit is in the retracted position, the lock tabs of the core unit carrier are interlocked with the second set of lock grooves.

13. The portable USB device of claim 12, wherein the core unit carrier further comprises a first side surface and a second side surface bended downwardly to form a U-shape channel, wherein edges of the first and second side surfaces are bended inwardly to form a U-shape tray to allow the core unit to slide into the core unit carrier in order for the core unit carrier to carry the core unit.

14. The portable USB device of claim 13, wherein the side surface of the core unit carrier having the slide button disposed thereon is made of elastic material having a front section, a rear section, and a center section coupled in between, wherein the front section and the rear section of the top surfaces are fixedly coupled to the first and second side surfaces at a frontend and a backend of the core unit carrier respectively while the center section is separately with an opening space from the first and second side surfaces respectively to allow the center section to resiliently move in and out while the front and rear sections are fixed with the frontend and backend of the core unit carrier.

15. The portable USB device of claim 14, wherein when the slide button is pressed inwardly, the center section of the side surface is resiliently pushed in which causes the lock tabs to be disengaged from the corresponding lock grooves of the top housing, and wherein when the slide button is released from pressing, the center section of the side surface resiliently recovers outwardly to a natural position which causes the lock tabs to be engaged with the corresponding lock grooves of the top housing to lock the core unit in either a deployed position or a retracted position.

16. The portable USB device of claim 15, wherein the core unit carrier further comprises a fingerprint cutout on the top surface and the core unit further comprises a fingerprint sensor disposed on a top surface of the core unit and exposed via the fingerprint cutout when the core unit slides into the core unit carrier, and wherein the fingerprint sensor is to scan a finger of the user to obtain an identity of the user to determine whether the user is eligible to access content stored in the MLC flash memory devices.

17. The portable USB device of claim 16, wherein the top housing further comprises a fingerprint sensing opening area to expose the fingerprint sensor when the core unit is deployed and the fingerprint sensor is covered by the top housing when the core unit is in the retracted position.

18. The portable USB device of claim 17, wherein the fingerprint sensor is disposed in a longitudinal orientation with respect to the core unit to allow the fingerprint sensor to scan the finger of the user when the finger slide back and forth on the fingerprint sensor.

19. The portable USB device of claim 11, wherein the core unit is implemented in one of a regular PCB (printed circuit board) package, a slim flash memory package and a COB (chip on bard) package, and wherein the top housing and the bottom housing are attached to each other via a snap together mechanism or an ultrasonic welding technique.

* * * * *